US008374482B2

(12) United States Patent
Tokunaka et al.

(10) Patent No.: US 8,374,482 B2
(45) Date of Patent: Feb. 12, 2013

(54) MEMORY CARD, IMAGING APPARATUS, AND RECORDING/REPRODUCING APPARATUS

(75) Inventors: Junzo Tokunaka, Kanagawa (JP); Mitsutoshi Shinkai, Kanagawa (JP); Yujiro Ito, Kanagawa (JP)

(73) Assignee: Sony Corporation (JP)

( * ) Notice: Subject to any disclaimer, the term of this patent is extended or adjusted under 35 U.S.C. 154(b) by 1234 days.

(21) Appl. No.: 11/999,769

(22) Filed: Dec. 7, 2007

(65) Prior Publication Data
US 2008/0159750 A1 Jul. 3, 2008

(30) Foreign Application Priority Data
Dec. 27, 2006 (JP) ................................ P2006-352604

(51) Int. Cl.
H04N 5/77 (2006.01)
(52) U.S. Cl. .......................................... 386/224; 365/9
(58) Field of Classification Search .................. None
See application file for complete search history.

(56) References Cited

U.S. PATENT DOCUMENTS
5,117,301 A * 5/1992 Tsumura ........................ 398/170
6,990,018 B2 * 1/2006 Tanaka et al. .............. 365/185.09

FOREIGN PATENT DOCUMENTS
| CA | 2 471 415 A1 | 7/2003 |
| JP | 62-203072 U | 12/1987 |
| JP | 63-131290 A | 6/1988 |
| JP | 63-216794 A | 9/1988 |
| JP | 8-147079 A | 6/1996 |
| JP | 10-171566 A | 6/1998 |
| JP | 10242477 A | 9/1998 |
| JP | 11105477 A | 4/1999 |
| JP | 2001-014432 A | 1/2001 |
| JP | 2002-313458 A | 10/2002 |
| JP | 2004-264908 A | 9/2004 |
| JP | 2005044177 A | 2/2005 |
| JP | 2005-526304 A | 9/2005 |
| WO | 2006033156 | 3/2006 |

OTHER PUBLICATIONS
Japanese Office Action issued in on Nov. 7, 2008 in connection with corresponding Japanese Appln. No. 2006-352604.
Office Action from Japanese Application No. 2008-334549, dated Aug. 30, 2011.

* cited by examiner

Primary Examiner — Huy T Nguyen
(74) Attorney, Agent, or Firm — Lerner, David, Littenberg, Krumholz & Mentlik, LLP

(57) ABSTRACT

Disclosed is a memory card attached to an external apparatus for transmitting and receiving data via the external apparatus and an optical communication. The memory card includes a power-supply potential unit receiving electric power supply at a predetermined voltage from the external apparatus; a ground potential unit connected to a ground potential unit of the external apparatus; a light-receiving unit receiving an optical signal transmitted from the external apparatus or another memory card; and a light-emitting unit transmitting the optical signal to the external apparatus or another memory card. In the memory card, the light-receiving unit and the light-emitting unit are arranged such that the signal received by the light-receiving unit and the signal transmitted from the light-emitting unit are transmitted in a straight line.

21 Claims, 13 Drawing Sheets

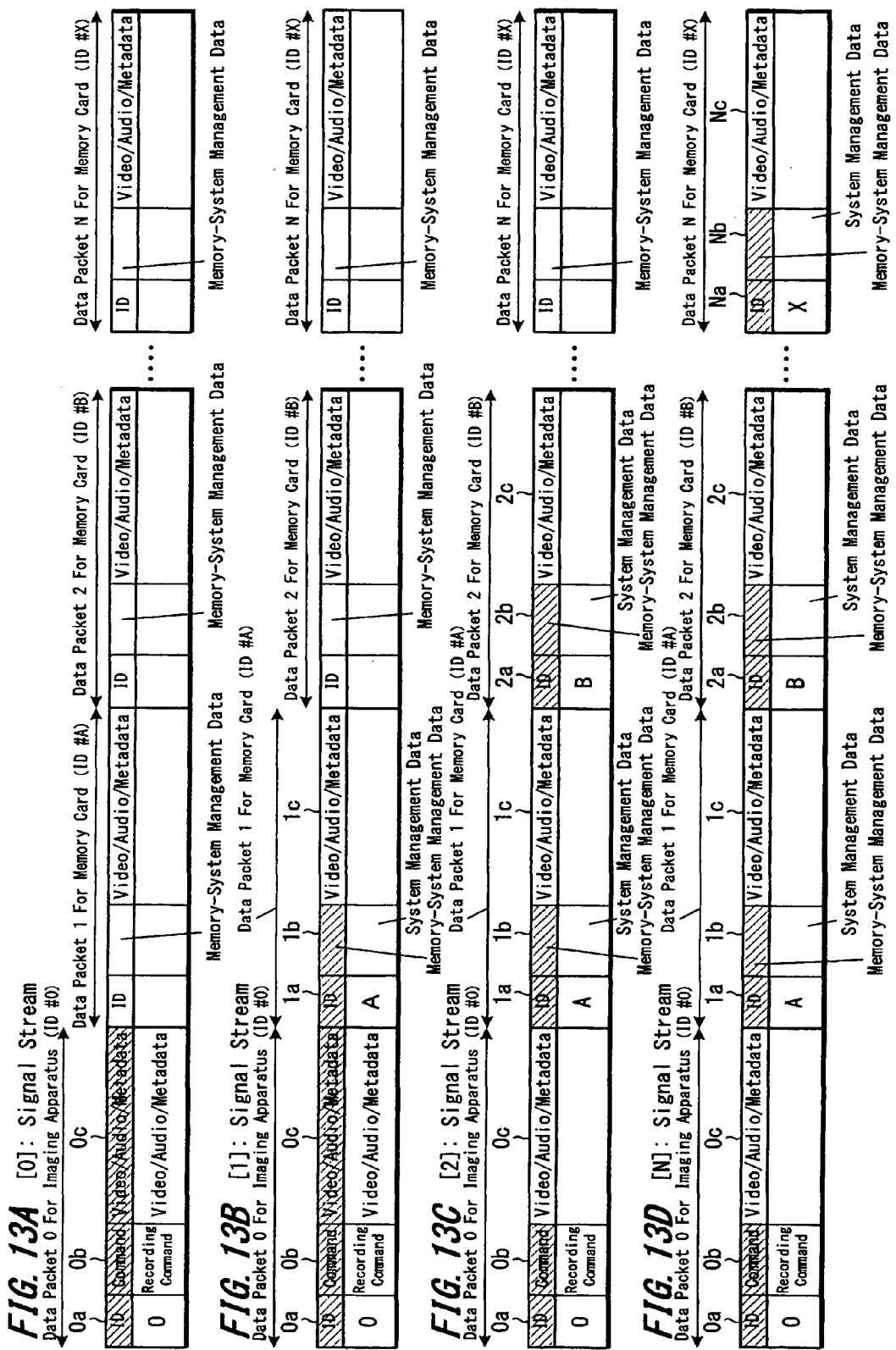

MEMORY CARD, IMAGING APPARATUS, AND RECORDING/REPRODUCING APPARATUS

CROSS-REFERENCE TO RELATED APPLICATIONS

The present application claims priority from Japanese Patent Application No. JP 2006-352604, filed in the Japanese Patent Office on Dec. 27, 2006, the entire content of which is incorporated herein by reference.

BACKGROUND OF THE INVENTION

1. Field of the Invention

The present invention relates to a memory card including a contact type power-supply potential unit and a non-contact type signal I/F, and an imaging apparatus and a recording/reproducing apparatus to which the memory card is attached.

2. Related Background Art

In recent years, attention has been paid to semiconductor memories as recording media for equipment that processes large volumes of data, such as high-resolution static images and moving images due to the following reasons. The semiconductor memory is small and lightweight, compared with a hard disk drive unit or the like. In addition, one of the characteristics in the semiconductor memory is reliabilities in shock resistance and vibration resistance. Furthermore, the semiconductor memory may not need constant rotation of a disk or the frequent movement of a magnetic head like the hard disk, and thus power saving can be realized. Besides, the semiconductor memory has further advantages, such as an increase in access speed and improvements in shock resistance and vibration resistance.

Furthermore, semiconductor memories are increasingly employed as recording media even in professionally used imaging apparatuses, recording/reproducing apparatuses, and the like as their storage capacities are increasing.

Japanese Unexamined Patent Application Publication No. 2004-264908 (JP 2004-264908 A) discloses that a plurality of memory cards can be employed as a single large-volume recording medium.

SUMMARY OF THE INVENTION

In a professional-use imaging apparatus or recording/reproducing apparatus, it is preferable that durability be required got a recording medium because data are recorded and retrieved tens of thousands of times via the recording medium. However, the recording medium may have little reliability in contact durability when the recording medium receives the supply of electric power or the supply of signals through a contact terminal.

In supplying the electric power using a non-contact system, for example, electric power supply may exhibit inferior efficiencies when an optical interface or the like is employed to supply the electric power. Under the present circumstances, the overall efficiency will demonstrate about 13% of the electric power supply. If the electric power is supplied using an optical interface, for example, the power consumption of the imaging apparatus in which the memory card is incorporated will be about 7.7 W provided that the power consumption (maximum instantaneous power) is set to 1 W. This implies that a loss of power will be 6.6 W (i.e., 7.7−1=6.6 W). Accordingly, it is undesirable that the apparatus be used as a professional-use commercial product.

The present invention intends to provide a memory card, an imaging apparatus, and a recording/reproducing apparatus with reliability in recoding of large-volume data while reducing power consumption.

According to an embodiment of the present invention, an apparatus having an external recording medium interface capable of enclosing a plurality of memory cards in vertical alignment includes a power-supply potential unit for electric power supply to the memory card when data are transmitted/received via the memory card using an optical signal; and a ground potential unit connected to the memory card. In addition, the apparatus further includes a light-emitting unit for transmitting an optical signal to the memory card and a light-receiving unit for receiving an optical signal transmitted from the memory card. Both the power-supply potential unit and the ground potential unit are mounted on the inner side face of the external recording medium interface where the memory card is to be inserted. Furthermore, both light-receiving unit and the light-emitting unit are arranged so that the a signal transmitted from the light-emitting unit and received by the memory card and a signal transmitted from the memory card and received by the light-emitting unit can be transmitted in line in the vertical direction.

As constructed above, the electric power supply to the memory card is carried out through a contact interface (hereinafter, referred to as I/F) and a signal is then transmitted through a non-contact I/F. As a result, an increase in contact durability of the memory card can be attained, while a loss of electric power supply to the memory card can be avoided.

According to an embodiment of the present invention, reliability in recoding of large-volume data can be attained while reducing power consumption.

BRIEF DESCRIPTION OF THE DRAWINGS

FIGS. 11A, 11B, 11C, and 11D illustrate different signal streams, respectively;

FIG. 13 is a diagram for illustrating an exemplified configuration of a signal packet in accordance with the embodiment of the present invention, where FIGS. 13A, 13B, 13C, and 13D, each illustrates different signal streams;

FIG. 14 is a diagram for illustrating an exemplified configuration of a memory card in accordance with another embodiment of the present invention, where

DESCRIPTION OF THE PREFERRED EMBODIMENTS

Hereinafter, an embodiment of the present invention will be described with reference to attached drawings. In this embodiment, an imaging apparatus capable of imaging, recording, and reproducing an image of a photographic subject will be described as an example of an apparatus using a memory card as a recording medium. The exemplified imaging apparatus is designed to incorporate a plurality of memory cards. The memory card receives power supply in a contact manner, while signal transmission is carried out through a non-contact I/F. In this example, the non-contact I/F used is an optical I/F.

Figure 1:
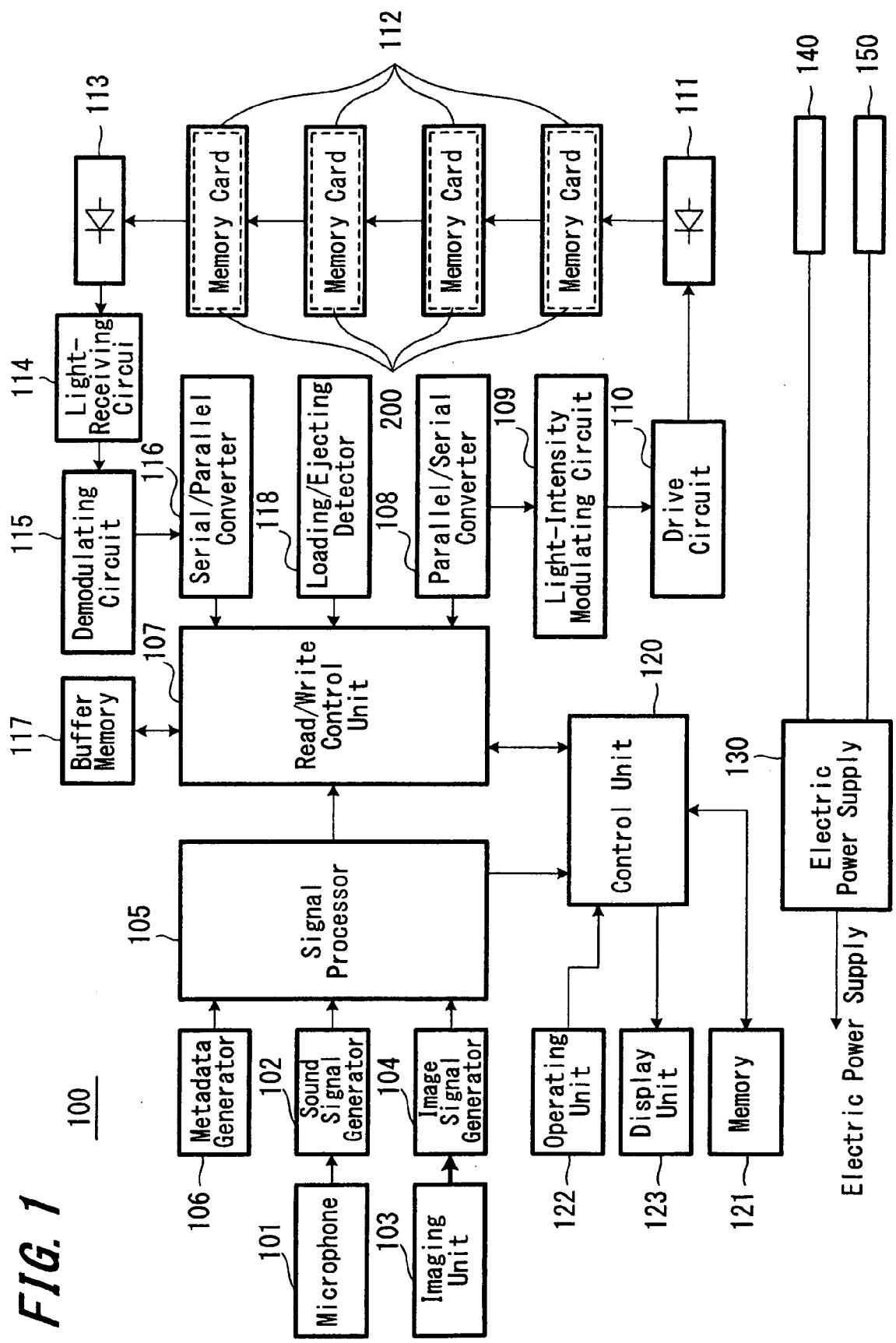
FIG. 1 is a block diagram of an exemplified configuration of an imaging apparatus in accordance with an embodiment of the present invention.

First, an example of the internal constitution of the imaging apparatus will be described with reference to a block diagram shown in FIG. 1. An imaging apparatus 100 is designed to incorporate two or more memory card 200 as recording media and provided with an external recording-medium I/F unit 112 in which a plurality of memory cards 200 can be inserted into the respective slots in vertical alignment. Furthermore, in this embodiment, the exemplified external recording-medium I/F unit 112 is, but not limited to, the one allowing the insertion of a plurality of memory cards 200. The present invention may be applied to the case in which only one memory card 200 is inserted.

A power-supply potential unit 140 (Vcc) for supplying electric power to the memory card 200 and a ground potential unit 150 (ground) are provided at a contact point of the side surface of the external recording-medium I/F unit 112 with the memory card 200 and respectively connected to an electric power supply 130 in the imaging apparatus 100. In addition, a light-emitting unit 111 is provided below the external recording-medium I/F unit 112. The light-emitting unit 111 carries out the electric/optic conversion of various instruction signals (commands) supplied to the memory card 200 and the electric/optic conversion of content data which are desired to be recorded, such as sound signals and video signals are supplied to the memory card 200.

The various kinds of command data or content data supplied to the memory card 200 are transmitted between a plurality of memory cards 200 inserted in the external recording-medium I/F unit 112 through the optical I/F and then finally received by a light-receiving unit 113. The light-emitting unit 111 includes, for example, a light-emitting diode (LED), while the light-receiving unit 113 includes a photodiode (PD). The internal constitution of each memory card 200, the information transmission between the memory cards 200, and the like will be described later in detail.

The imaging apparatus 100 includes a microphone 101 for collecting sounds around the imaging apparatus 100 and a sound signal generator 102 for converting the sounds obtained by the microphone 101 into sound signals. In addition, the imaging apparatus also includes an imaging unit 103 and an image signal generator 104. The imaging unit 103 is provided for generating a video signal by photoelectric conversion of an image of a photographic subject obtained through a lens (not shown). The image signal generator 104 is provided for removing a noise in the video signal obtained by the imaging unit 103 and converting the video signal into a digital signal.

Each frame of the video data obtained by the imaging unit 103 is provided with a time code generated from a metadata generator 106. The term "time code" means an absolute time in each frame of the video data. Thus, it is possible to electronically edit a movie every frame. In addition, the metadata generator 106 generates attribute information (metadata) of video data obtained by the imaging unit 103. The term "metadata" means a content ID for identifying content data, such as video data and sound data, the length (time) of the content, video-sampling rate, and resolution.

A signal processor 105 receives a time code and metadata generated from the metadata generator 106, a sound signal obtained through the microphone 101, and the video signal obtained through the imaging unit 103. Subsequently, the signal processor 105 carries out an automatic white balance processing for adjusting a white balance of the video signal, a γ-correction processing, and the like while compressing the video signal into the Moving Picture Experts Group (MPEG)-2 format, or the like. The signal processing part 105 is provided with a synchronizing signal generator (not shown) and supplies a synchronizing signal (clock) to each part of the imaging apparatus 100 including the memory card 200. In this embodiment, various signals are overlaid with clocks and then sent to the memory card 200.

The video signals and clocks generated from the signal processor 105 are supplied to a read/write control unit 107. A control unit 120 includes a central processing unit (CPU) and controls the respective units of the imaging apparatus 100. The control unit 120 is connected to a memory 121. The control unit 120 reads out and executes a program stored in the memory 121. In addition, the memory 121 may appropriately store data, programs, and the like for executing various kinds of processing.

Furthermore, the imaging apparatus 100 is provided with an operating unit 122 including buttons, switches, and the like for instructing recording and reproduction, and a display unit 123 including a liquid crystal, and the like. When the control unit 120 detects an operation-input signal from the operating unit 122, the control unit 120 controls each unit depending on the operation-input signal. Subsequently, the display unit 123 displays a video obtained by the imaging unit 103, a video stored in the memory card 200, or the like according to an instruction signal, and the like generated from the control unit 120 on the basis of the operation input from the operating unit 122.

Under the control from the control unit 120, the read/write control unit 107 controls the reading or writing data on the memory card 200 inserted in the external recording-medium I/F unit 112. The read/write control unit 107 also controls the reading or writing data on a buffer memory 117. The buffer memory 117 is used for temporally storing video data with a data amount of almost 7 to 8 seconds.

When another memory card 200 unused is pulled out (eject), or an additional memory card 200 is inserted (loaded), the recording currently being carried out on the aforementioned memory card is suspended. Furthermore, during several seconds until the loading/ejecting of the memory card 200 is completed, the buffer memory 117 is designed to be used as a safe area of video data which would have been recorded on the memory card 200. At this moment, the reading of the video data from the buffer memory 117 and writing of the video data on the memory card 200 are carried out at a speed higher than that of the writing of data on the buffer memory 117, thereby recording the video data on the memory card 200 without delay.

Of data supplied to the read/write control unit 107, the one addressed to the memory card 200 inserted into the external recording-medium I/F unit 112 is converted into a serial signal by a parallel/serial converter 108. Data transmitted from the read/write control unit 107 to the parallel converter 108 includes various kinds of commands, such as an initial command, a recording command, and a reproduction command, and video data or the like stored in the memory card 200.

The initial command is a command for authenticating the memory card 200 when the imaging apparatus 100 is powered on or when the memory card 200 is loaded to or ejected from the external recording-medium I/F unit 112. The recording command is used for instructing the given memory card 200 to record data. In contrast, the recording command receives inputs of the ID of the target memory card 200, a start point of a data-recording area (start data address) and an end point thereof (stop data address), the type of recording content (clip number), and the like. The unique IDs are previously assigned to the respective memory cards 200, so that the imaging apparatus 100 can specify the memory card 200 to be used by designating the ID thereof. The reproduction command describes a command for reproducing video data stored in the memory card 200. In the reproduction command, the ID of the memory card 200, the address of the area that stores the data to be read, and the like.

A serial signal converted by the parallel/serial converter 108 is supplied to a light-intensity modulating circuit 109. The light-intensity modulating circuit 109 modulates input data to obtain light with an intensity corresponding to the amount of the data. Subsequently, the light-emitting unit 111 is driven by a drive circuit 110. The signal is subjected to electric/optic conversion in the light-emitting unit 111 and the resulting optical signal is then supplied to the light-receiving unit of the memory card 200. The transmission of optical signals carried out between a plurality of memory cards 200 will be described later.

Of the memory cards 200 inserted in the external recording-medium I/F unit 112 in vertical alignment, a command or content data can be transmitted to the memory card 200 inserted at the position closest to the light-receiving unit 113 of the imaging apparatus 100. When transmitted, the information about such transmission is transmitted as an optical signal from the light-emitting unit of the memory card 200 to the light-receiving unit 113.

The light-receiving unit 113 may include, for example, PD and generates a current corresponding to the amount of light received. The light-receiving unit 113 is connected to a light-receiving circuit 114. The light-receiving circuit 114 converts an electric current generated therefrom into a voltage and then amplifies the voltage to generate a digital signal. In addition, the light-receiving circuit 114 includes an automatic gain control circuit (AGC) circuit (not shown) for automatically adjusting an amplification factor (gain). Thus, the light-receiving circuit 114 transmits the generated digital signal to a demodulating circuit 115.

The demodulating circuit 115 obtains a base-band signal by demodulation of the input digital signal. The demodulating circuit 115 then supplies the obtained base-band signal to a serial/parallel converter 116. Subsequently, the serial/parallel converter 116 converts an input signal into a parallel signal and then supplies it to the read/write control unit 107.

Furthermore, the imaging apparatus 100 is provided with a loading/ejecting detector 118 for detecting loading or ejection when the memory card 200 is inserted into or ejected from the external recording-medium I/F unit 112.

Referring back to FIG. 2, a configuration example of the memory card 200 to be inserted into the external recording-medium I/F unit 112 of the imaging apparatus 100 will be described.

Figure 2:
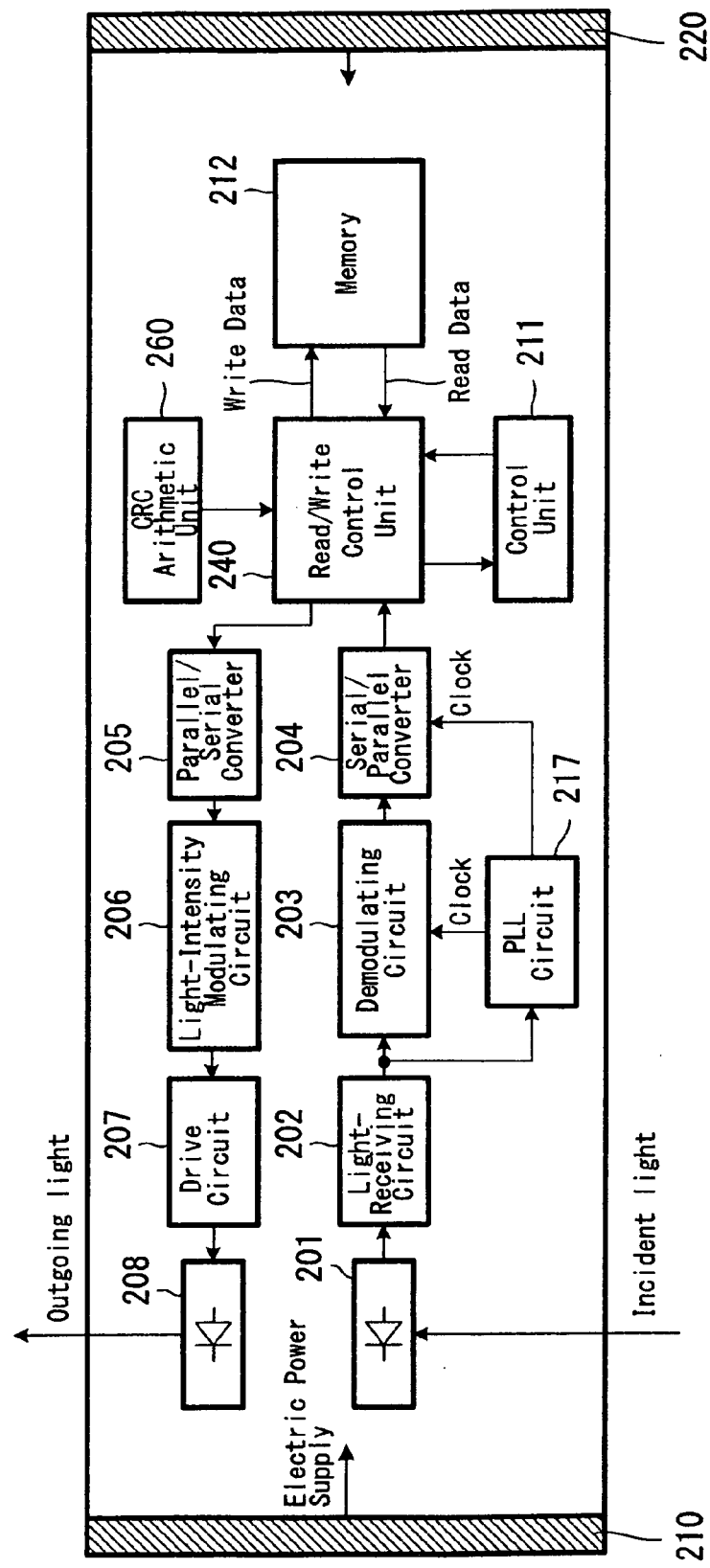
FIG. 2 is a block diagram of an exemplified configuration of a memory card in accordance with the embodiment of the present invention.

A memory card 200 shown in FIG. 2 includes a power-supply potential unit 210 on the side face thereof as a contact terminal where an electric power is supplied. The power-supply potential unit 210 is designed to contact with the power-supply potential unit 140 formed on the side face of the external recording-medium I/F unit 112 of the imaging apparatus 100. Thus, the power-supply potential unit 210 is allowed to receive the supply of electric power while being inserted in the external recording-medium I/F unit 112. In addition, the other side face of the memory card 200, which is opposite to the power-supply potential unit 210, is provided with a ground potential unit 220. The ground potential unit 220 is also designed to contact with the ground potential unit 150 formed on the side face of external recording-medium I/F unit 112 of the imaging apparatus 100. The details of the arrangement of both the power-supply potential unit 210 and the ground potential unit 220 will be described later.

The memory card 200 shown in FIG. 2 includes a light-receiving unit 201 as a signal-receiving unit. The light-receiving unit 201 includes, for example, PD, that generates electric current corresponding to the amount of light received. The light-receiving unit 202 is connected to a light-receiving circuit 201. The light-receiving circuit 202 converts an electric current generated therefrom into a voltage and then amplifies the voltage to generate a digital signal. In addition, the light-receiving circuit 202 includes an automatic gain control circuit (AGC) circuit (not shown) for automatically adjusting an amplification factor (gain). Thus, the light-receiving circuit 202 transmits the generated digital signal to a demodulating circuit 203.

The demodulating circuit 203 obtains a base-band signal by demodulation of the input digital signal. Then, the demodulating circuit 203 supplies the obtained base-band signal to a serial/parallel converter 204. Furthermore, the memory card 200 includes a phase locked loop circuit (PLL) 217 where clocks overlaid on signals are extracted. The extracted clocks from the PLL circuit 217 are then supplied to the demodulating circuit 203 and the serial/parallel converter 204. The PLL circuit 217 may optionally change a clock frequency. The serial/parallel converter 204 converts the input signal into a parallel signal and then supplies the signal to a read/write control unit 240. When a command transmitted from the imaging apparatus 100 is present in the signal entered in the read/write control unit 240, the command is transmitted to a control unit 211.

Furthermore, the memory card 200 includes a cyclic redundancy check (CRC) arithmetic unit 260 and checks whether the obtained data has a data-transfer error.

The control unit 211 includes a central processing unit (CPU), and the like. When the control unit 211 receives a command transmitted from the imaging apparatus 100, the control unit 211 generates an instruction signal corresponding to the command and then supplies such a signal to a read/write control unit 240. Furthermore, the read/write control unit 240 includes a memory controller, and the like, and controls the writing of data on a memory 212 or the reading of data from the memory 212 on the basis of an instruction signal or a control signal supplied from the control unit 211. The memory 212 may be a non-volatile semiconductor memory or the like.

When the read/write control unit 240 receives a command from the imaging apparatus 100 and then determines that the memory card thereof is not the target of the command, the read/write control unit 240 transfers such a command to another memory card 200; that is, the one located at an upper position in the parallel arrangement of memory cards 200. In addition, content data may be read and transmitted by another memory card 200 received a regeneration command from the imaging apparatus 100. In this case, such content data may also be transmitted to the upper memory card 200.

Various signals output from the read/write control unit 240 are converted into serial signals by a parallel/serial converter 205 and then transmitted to a light-intensity modulating circuit 206. Then, the light-intensity modulating circuit 206 modulates the input signal into light with an intensity corresponding to the amount of data. Subsequently, a light-emitting unit 208 is driven by a drive circuit 207. The signal is subjected to electric/optic conversion in a light-emitting unit 208. The generated optical signal is then supplied to the light-receiving unit 201 of the memory card 200 located at the upper position or the light-receiving unit 113 of the imaging apparatus 100.

In the present embodiment, the light-receiving circuit 114 of the imaging apparatus 100 and the light-receiving circuit 202 of the memory card 200 are configured to include AGC circuits, respectively. However, these light-receiving circuits may be configured to include AGC circuits, respectively.

Figure 3:
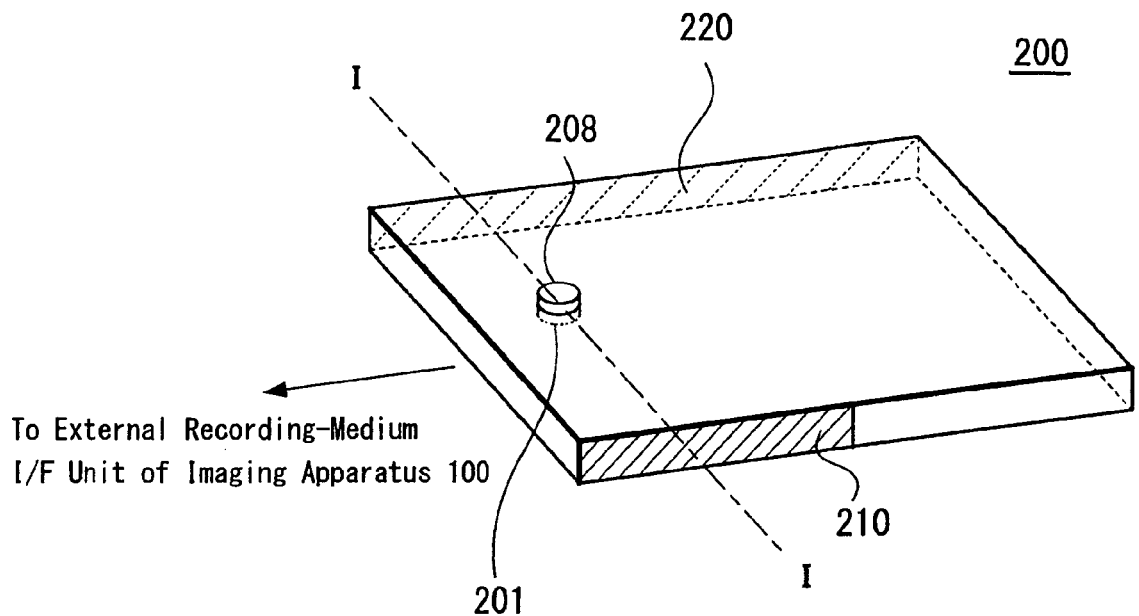
FIG. 3 is a perspective view showing an exemplified configuration of the memory card in accordance with the embodiment of the present invention.

Next, an example of the arrangement of both the power-supply potential unit 210 and the ground potential unit 220 in the memory card 200 will be described with reference to FIG. 3. FIG. 3 is an external perspective view of the memory card 200. The memory card 200 shown in FIG. 3 is provided with an enclosure made of a molded material or the like. A wiring substrate (not shown) is incorporated in the memory card 200. The light-emitting unit 208 is mounted on the upper surface of the wiring substrate, while the light-receiving unit 201 is mounted on the under surface of the wiring substrate. Both the light-emitting unit 208 and the light-receiving unit 201 are represented by broken lines in FIG. 3. In addition, both parts are vertically arranged in line in the thickness direction of the memory card.

The direction indicated by an arrow in FIG. 3 corresponds to the direction of inserting the memory card 200 into the external recording-medium I/F unit 112 of the imaging apparatus 100. The power-supply potential unit 210 is formed on the anterior side face of the memory card 200, while the ground potential unit 220 is formed on the opposite side (posterior side face) of the memory card 200. The ground potential unit 220 is formed so as to overlay 100% of the side face of the memory card 200. In contrast, the power-supply potential unit 210 is formed so as to overlay almost 50% of the side face of the memory card 200. Besides, the position of the power-supply potential unit 210 formed is on the side to be inserted into the external recording-medium I/F unit 112. Furthermore, FIG. 4 shows the memory card 200 as constructed above being inserted in the external recording-medium I/F unit 112 of the imaging apparatus 100.

Figure 4:
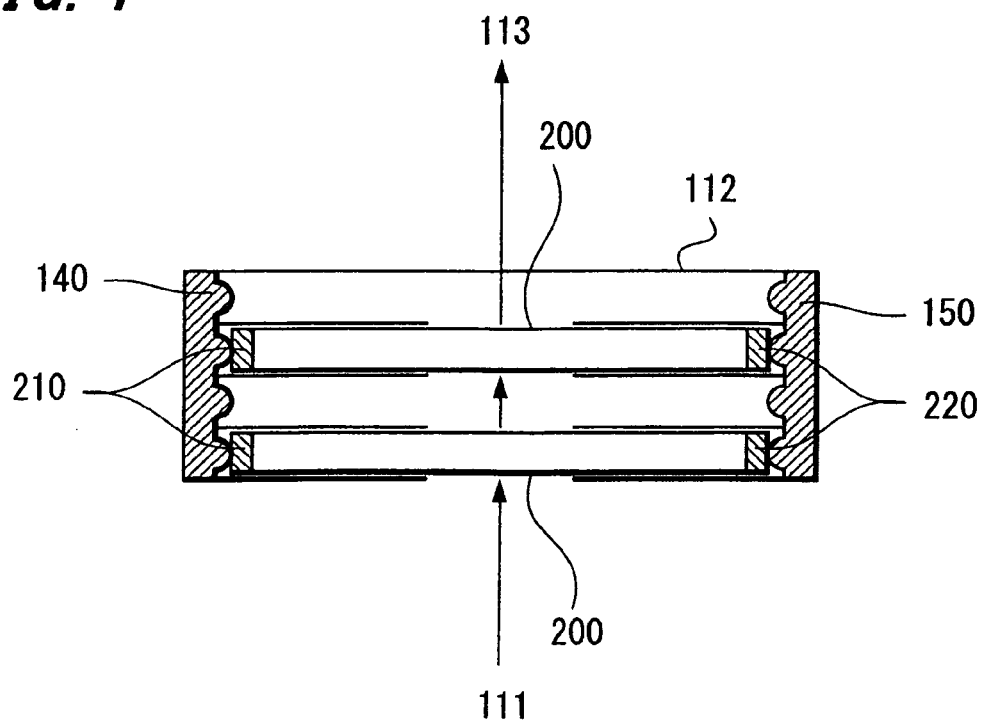
FIG. 4 is a front view showing an example of a contact of the memory card and the external recording-medium I/F unit in accordance with the embodiment of the present invention.

FIG. 4 is a schematic cross-sectional view of external recording-medium I/F unit 112 of the imaging apparatus 100 viewing the from the insertion opening thereof. In FIG. 4, the external recording-medium I/F unit 112 is provided with four slots capable of enclosing memory cards 200, respectively. In this figure, the respective memory cards 200 are inserted in the second and fourth slots from the top, respectively. As viewed from the front of the figure, the left side face of the external recording-medium I/F unit 112 is provided with the power-supply potential unit 210 and the right side surface thereof is provided with the ground potential unit 220. For improving the contact with the memory card 200, the power-supply potential unit 210 and the ground potential unit 220 are provided with a plate spring and a protruded portion, respectively. The power-supply potential unit 210 of the imaging apparatus 100 is contacted with the power-supply potential unit 140 of the memory card 200 through the protruded portion, thereby allowing the imaging apparatus 100 to provide the memory card 200 with the supply of electric power. The electric power supply from the memory card 200 to the power-supply potential unit 210 is continued as far as the electric power supply of the imaging apparatus 100 is being switched on. In addition, the contact potential unit 220 of the imaging apparatus 100 is contacted with the ground potential unit 150 of the memory card 200 to provide the power-supply potential unit 140 in the memory card 200 with a ground electrode.

In the state where the memory cards 200 are being inserted in vertical alignment as shown in FIG. 4, an optical signal transmitted from the light-emitting unit 111 of the imaging apparatus 100 is then transmitted to a memory card 200 located at the position closest to the light-emitting unit 111 and another memory card 200 located at the position upper than that memory card 200. Finally, the optical signal is received by the light-receiving unit 113 of the imaging apparatus 100. In FIG. 4, subsequently, a signal generated from the light-emitting unit 111 of the imaging apparatus 100 and then received by the memory card 200 and a signal generated from the memory card 200 and then received by the light-receiving unit 113 of the imaging apparatus 100 are transmitted in a straight line with each other in the vertical direction.

Figure 5:
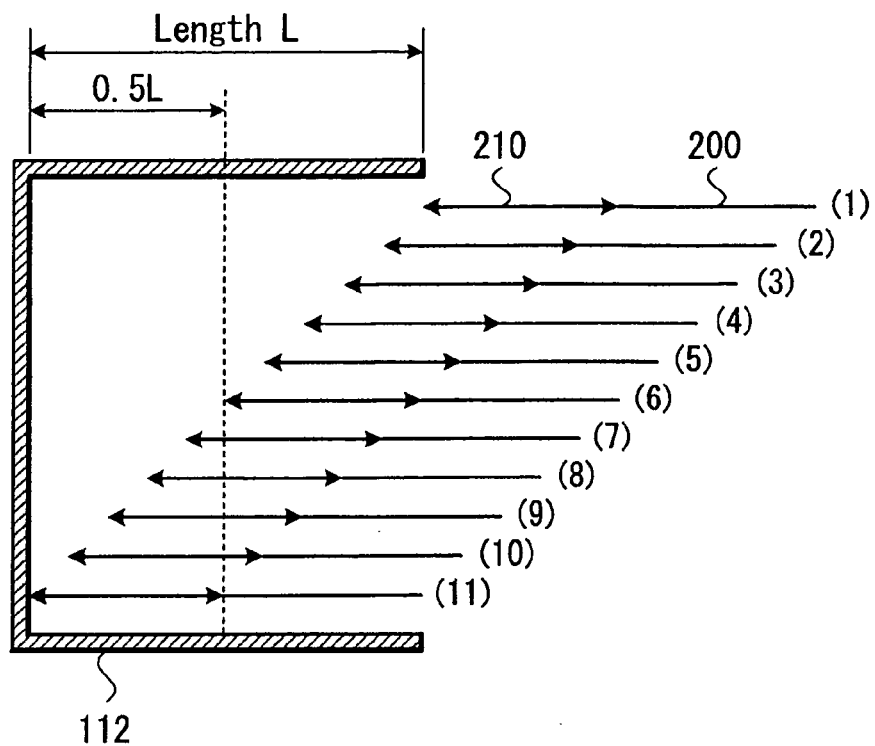
FIG. 5 is a diagram for illustrating a relationship between an insertion position of a memory card and a starting position of electric power supply in accordance with the embodiment of the present invention.
Figure 6:
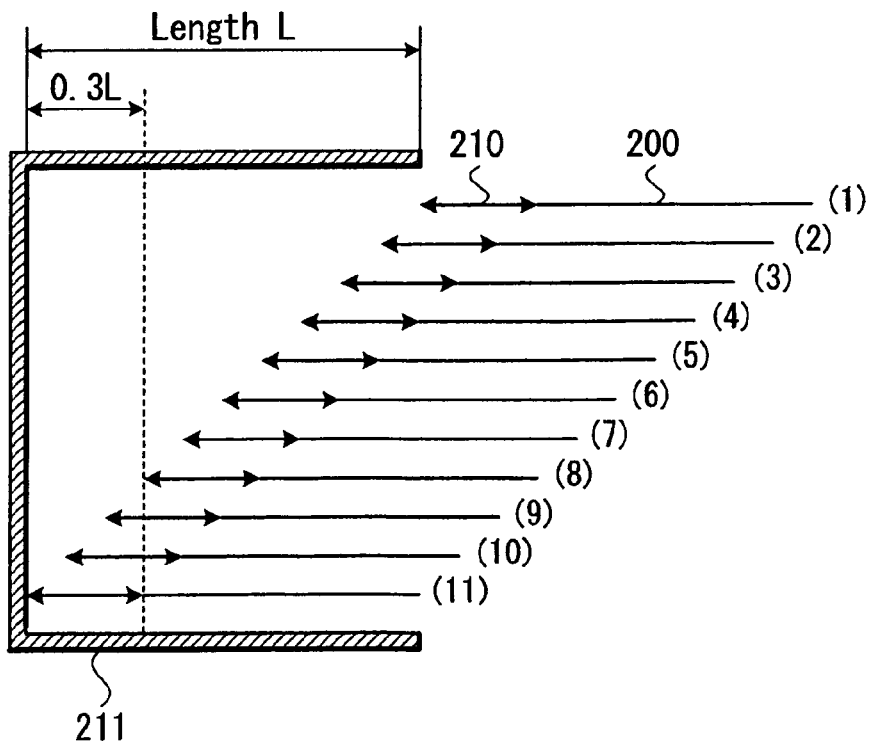
FIG. 6 is another diagram for illustrating the relationship between an insertion position of the memory card and a starting position of electric power supply.

Next, the relationship between the position of the memory card 200 in the depth direction of inserting the memory card 200 into the external recording-medium I/F unit 112 of the imaging apparatus 100 and the electric power supply to the memory card 200 will be described with reference to FIG. 5 and FIG. 6. Each of FIG. 5 and FIG. 6 is a cross-sectional view of the external recording-medium I/F unit 112 from the side face thereof. The positions at which the memory card 200 is inserted into the external recording-medium I/F unit 112 are illustrated in stages from the most front side position (1) to the loading-completed position (11). In FIG. 5 and FIG. 6, the power-supply potential unit 210 of the memory card 200 is indicated by the bidirectional arrow. The power-supply potential unit 140 of the image apparatus 100 is represented by a ratio (0.5 L) thereof to the length L of the external recording-medium I/F unit 112 in the depth direction. In addition, for making clearly representing a portion with the power-supply potential unit 140 and a portion without the power-supply potential unit 140, the boundary between these portions are represented by a broken line.

As exemplified in FIG. 3, FIG. 5 is a diagram representing an example in which the power-supply potential unit 200 of the memory card 200 is formed so as to overlay almost 50% of the front side face of the memory card 200. The position of the power-supply potential unit 140 arranged on the external recording-medium I/F unit 112 and the length thereof are designed so as to correspond to the power-supply potential unit 210 of the memory card 200. In FIG. 5, the length of the power-supply potential unit 140 is represented as almost the half (0.5 L) of the length L of the external recording-medium I/F unit 112 in the depth direction.

In this case, when the inserting position of the memory card 200 is any of (1) to (5), the power-supply potential unit 210 of the memory card 200 may not be in contact with the power-supply potential unit 140. Thus, any electric power supply to the memory card 200 will not occur. In contrast, when inserted into the position (6), the memory card 200 is first allowed to obtain the electric power supply. The insertion of the memory card 200 is carried out by the user's hand, so that the user may hold the front side (in the insertion direction) of the memory card 200. As shown in FIG. 5, the power-supply potential unit 210 of the memory card 200 is designed to be positioned on the anterior half portion of the memory card 200 in the insertion direction. Thus, in the state of being supplied with electric power, the power-supply potential unit 210 of the memory card 200 is almost completely enclosed in the imaging apparatus 100. Thus, the user will not touch the power-supply potential unit 210 of the memory card 200.

The percentage of the power-supply potential unit 210 of the memory card 200 being arranged may be 50% or less with respect to the area of the side face of the memory card 200 on which the power-supply potential unit 210 is arranged. As shown in FIG. 6, even if the percentage is 30%, the user can be prevented from touching the electric power supply 210 of the memory card 200 in the state where the electric power is supplied.

In this way, the electric power supply to the memory card 200 is performed in a contact fashion, so that a loss of electric power supply to the memory card 200 can be avoided. Thus, low power consumption in the imaging apparatus 100 can be realized.

Furthermore, a signal is written on or read out of the memory card 200 through the optical I/F, that is, the non-contact I/F, so that an increase in durability to read and write of signals can be attained, compared with the case in which signals are supplied through a contact terminal.

Furthermore, in the present embodiment, the power-supply potential unit 210 of the memory card 200 is formed on the side face of the memory card 200. Alternatively, however, the power-supply potential unit 210 may be formed on the upper surface, the under surface, or the tip portion of the memory card 200 as far as it is a position where the user can be prevented from touching the power-supply potential unit 210 in the state that the memory card 200 receives the electric power supply.

Furthermore, in the present embodiment, the power-supply potential unit 210 of the memory card 200 is formed on the left side and the ground potential unit 220 on the right side in the insertion direction. This type of arrangement is employed because numerous users are right-handed. Alternatively, however, the power-supply potential unit 210 and the ground potential unit 220 may be arranged on the opposite sides, respectively.

Furthermore, in the present embodiment, the number of times of reading/writing signals from/to the memory card 200 is not particularly controlled. However, the number of times of read/write in the main body of the memory card 200 may be counted and a warning or the like may be performed depending on the obtained counted number. In other words, a counter or the like is mounted on each of the memory cards and then the counted numbers obtained by the respective counters are stored in the memory 212 or the like. Then, the counted numbers stored in the memory 212 is transmitted to the imaging apparatus 100. Subsequently, the imaging apparatus 100 compares the counted number from the memory card 200 with the predefined threshold. If the counted number is close to the threshold, then a warning may be generated. In this case, the warning may be displayed on the display unit 123 or may be sounded from a speaker (not shown). Alternatively, the warning may be sounded simultaneously with displaying. When performing such management, the number of times of read/write in every slot of the external recording-medium I/F-112 in which memory card 200 is inserted is also controlled simultaneously.

Furthermore, as described above, the memory card 200 of the present embodiment is designed as follows. The memory card 200 is inserted into the imaging apparatus 200. Then, the memory card 200 receives the supply of electric power upon contacting the power-supply potential unit 210 of the memory card 200 with the power-supply potential unit 140 of the imaging apparatus. Alternatively, the electric power supply to the memory card 200 may be independently performed for every slot of the external recording-medium I/F unit 112 in which the memory card 200 is inserted. In other words, a switch or the like for electric power supply is provided for every slot, so that the electric power supply to the memory card 200 may be switched on/off by turning on/off the switch. Where the electric power supply is not carried out until the memory card 200 is completely inserted in the slot, the overlaid area of the power-supply potential unit 210 may be the 100% area of the side face of the memory card 200.

In this case, furthermore, the insertion/ejection of the memory card 200 into/from the slot may be detected by a non-contacting system using LED or the like instead of a physical mechanism such as a switch.

Figure 7:
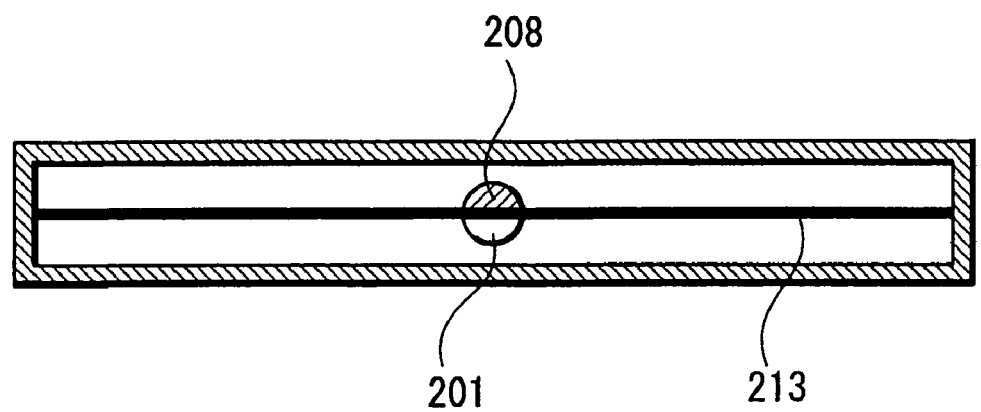
FIG. 7 is a cross-sectional view showing an exemplified arrangement of a light-receiving unit and a light-emitting unit in accordance with the embodiment of the present invention.

Next, an example of the arrangement of both the light-emitting unit 208 and the light-receiving unit 201 in the memory card 200 will be described with reference to FIG. 7. FIG. 7 is a cross-sectional view along the line I-I in FIG. 3. In FIG. 7, a wring substrate 213 is enclosed in the memory card. The light-emitting unit 208 is arranged on the upper surface of the wiring substrate 213 and the light-receiving unit 201 on the underside thereof. Such an arrangement allows a signal received by the light-receiving unit 201 of the memory card 200 and a signal transmitted from the light-emitting unit 208 to be transmitted in one straight line in the vertical direction. Consequently, an optical signal can be transmitted to the light-receiving unit 113 provided above the external recording-medium I/F unit 112 of the imaging apparatus 100.

Figure 8:
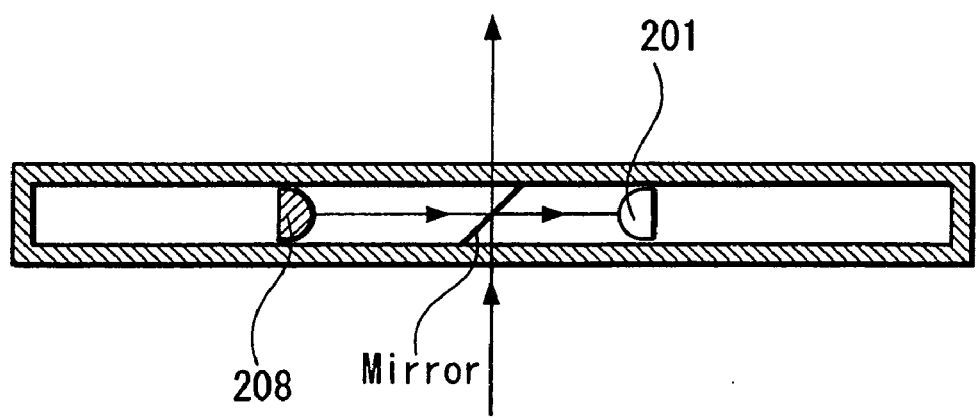
FIG. 8 is a cross-sectional view showing an exemplified arrangement of a light-receiving unit and a light-emitting unit in accordance with the embodiment of the present invention.

In this example, the light-receiving unit 201 and the light-emitting unit 208 of the memory card 200 are vertically arranged one above the other with the wiring substrate 213 placed in between. Alternatively, for reducing the height of the arrangement in the thickness direction of the memory card 200, as shown in FIG. 8, the light-receiving unit 201 and the light-emitting unit 208 of the memory card 200 may be disposed side by side in the horizontal direction. Here, FIG. 8 is also a cross-sectional view along the line I-I in FIG. 3. For designing the configuration of the memory card 200 in this way, a mirror may be placed between the light-receiving unit 201 and the light-emitting unit 208 and inclined at an angle of 45 degrees to these units. That is, the mirror allows an optical signal transmitted from the imaging apparatus 100 or another memory card 200 to be reflected in the direction along which the light-receiving unit 201 is arranged. This arrangement allows an optical signal from the light-emitting unit 208 to be reflected upward.

Figure 9:
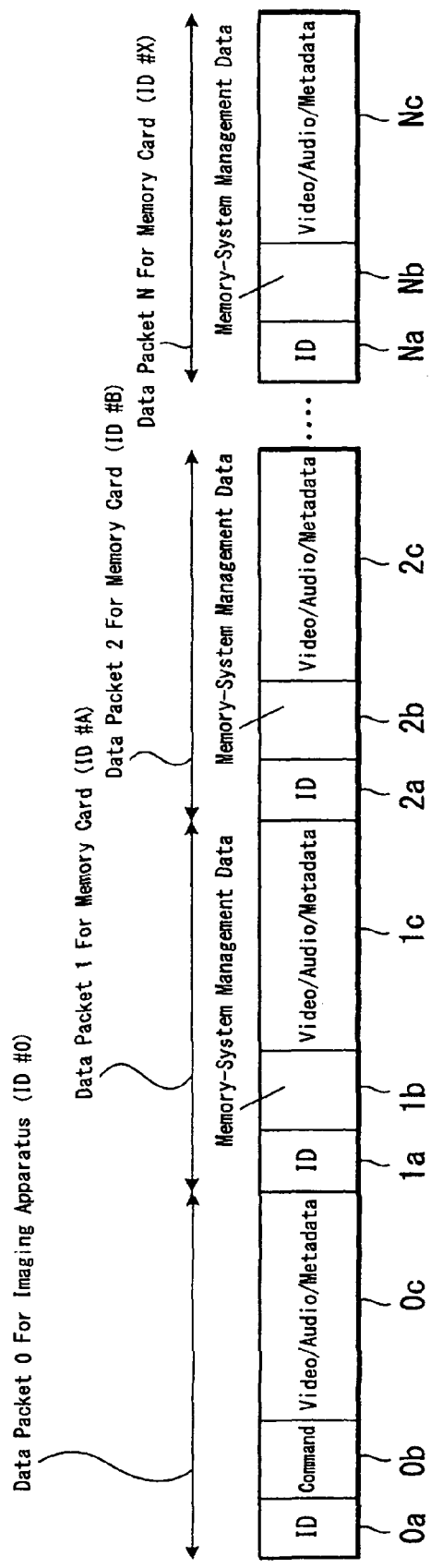
FIG. 9 is a diagram for illustrating an exemplified configuration of a signal packet in accordance with the embodiment of the present invention.

Next, an example of a process of signal transmission between the imaging apparatus 100 and each of the memory cards 200 and a process of signal transmission between the memory cards 200 will be described with reference to FIGS. 9 to 11, respectively. First, referring to FIG. 9, an exemplified configuration of a data packet of a signal transmitted between the imaging apparatus 100 and the memory card 200 or between the memory cards 200. The data packets include a data packet 0 having area 0a, an area 0b, and an area 0c; a data packet 1 having area 1a, an area 1b, and an area 1c; a data packet 2 having area 2a, an area 2b, and an area 2c; and a data packet N having area Na, an area Nb, and an area Nc, which are aligned in this order from the left side.

The data packet 0 is an area provided for the imaging apparatus 100 and the data packets 1 to N are areas provided for the respective memory cards 200. The "N" of the data packet N indicates the number of the memory cards 200 to be inserted into the external recording-medium I/F unit 112 of the imaging apparatus 100. The number assigned to "N" varies according to the number of the inserted memory cards 200.

In the area 0a of the data packet 0, the ID ("0" in this example) of the imaging apparatus 100 is written. In the area 0b, a command for the memory card 200 is written. If a command is a recording command for recording content data on the memory card 200, then the content data, such as video data, audio data, and metadata, which are desired to be recorded on the memory card 200, is recorded in the area 0c. The data to be written in the area 0c may include not only high-resolution data but also low-resolution data for thumbnail view.

The data packet 1 is an area allocated to the memory card 200 that has first received a signal transmitted from the imaging apparatus 100. In other wards, it is an area for the memory card 200 to be inserted at the position closest to the light-emitting unit 111 of the imaging apparatus 100. In this example, the corresponding memory card 200 is defined as one having the memory card ID #A. The data packet 2 is assigned to the memory card 200 that has received a signal from the memory card 200 assigned with the data packet 1. In this example, the corresponding memory card 200 is defined as the one having the memory card ID #B. In this way, the areas of the respective data packets 1 to N are assigned to the respective memory card 200 in the order of receiving signals transmitted from the imaging apparatus 100.

In the areas of the respective data packets 1 to N, the IDs of the respective memory cards 200 (the identification information of the respective memory cards 200) are written in the areas 1a to Na, respectively. In the respective areas 1b to Nb represented as "memory-system management data", the management information for the respective memory cards 200 is written. The management information includes information about recorded address spaces and empty address spaces in each memory card 200 and information about the types of content (clip numbers) retained in each memory card 200. The information is transmitted from one memory cards 200 to the next and then input in the imaging apparatus 100. Thus, the imaging apparatus 100 is informed of the number of the memory cards 200 and is capable of assessing the capacity of each memory card 200. As a result, the imaging apparatus 100 can have control of defining which memory card 200 is to be used for recording content, and the like. Furthermore, video data, audio data, metadata, and the like stored in the memory cards 200 are written in the areas 1c to Nc represented as "Video/Audio/Metadata", respectively.

Next, an example of processing will be described with reference to a flow chart in FIG. 10, where an initial command is transferred from the imaging apparatus 100 to the memory card 200, and then the memory card 200 receiving the initial command sends both the ID and the management information of the memory card back to the imaging apparatus. First, the loading/ejecting detector 118 of the imaging apparatus 100 determines whether the memory card 200 is being loaded or ejected in/from any slot of the external recording-medium I/F unit 112 (Step S1). If it is determined that any of the memory cards 200 inserted into the respective slots is being loaded or ejected, then the processing returns to Step S1. If it is determined that any memory card 200 is not being loaded or ejected, an initial command is issued by the control unit 120 of the imaging apparatus 100 (Step S2) and then transmitted to the memory card 200 (Step S3).

A packet transmitted here is defined as a "signal stream [0]" and the exemplified configuration of the packet transmitted over the signal stream [0] is shown in FIG. 11A. In FIG. 11A, the ID of the imaging apparatus, "0", is described in the area of "ID" (area 0a). In addition, "initial command" is described on the storage area (area 0b) of the command.

Referring back to FIG. 10, the packet transmitted from the imaging apparatus 100 in Step S3 is received by the memory card 200 (ID #A) located at the position closest to the light-emitting unit 111 of the imaging apparatus 100 (Step S4). When light-receiving unit 201 (see FIG. 2) of the memory card 200 receives the signal, the CRC arithmetic unit 260 carries out the error detection of the received packet (Step S5). If any error has been detected, then an error status is written on the data packet (Step S6). The memory card 200 with the ID #A has first received a signal transmitted from the imaging apparatus 100. Thus, the data packet 1, which is next to the data packet 0, is assigned. Therefore, the error status can be also written on the data packet 1.

If no error has been detected in Step S5, the memory card 200 writes its own ID and system management data on the data packet 1 (Step S7), and such data are then transmitted from the light-emitting unit 208 (see FIG. 2) (Step S8). The packet to be transmitted here is indicated as "signal stream [1]" and the exemplified configuration of the packet transmitted over the signal stream [1] is illustrated in FIG. 11B.

In FIG. 11B, the data packet 1, which is an area next to the data packet 0, is assigned to the memory card 200 (ID #A). The ID of the memory card 200, "A" is written in the area of "ID" (area 1a). System management data are written in the area for storing "memory-system management data" (area 1b). As described above, the system management information includes information about recorded address spaces and empty address spaces in each memory card 200 (ID #A) and information about the types of content (clip numbers) retained in each memory card 200.

Figure 10:
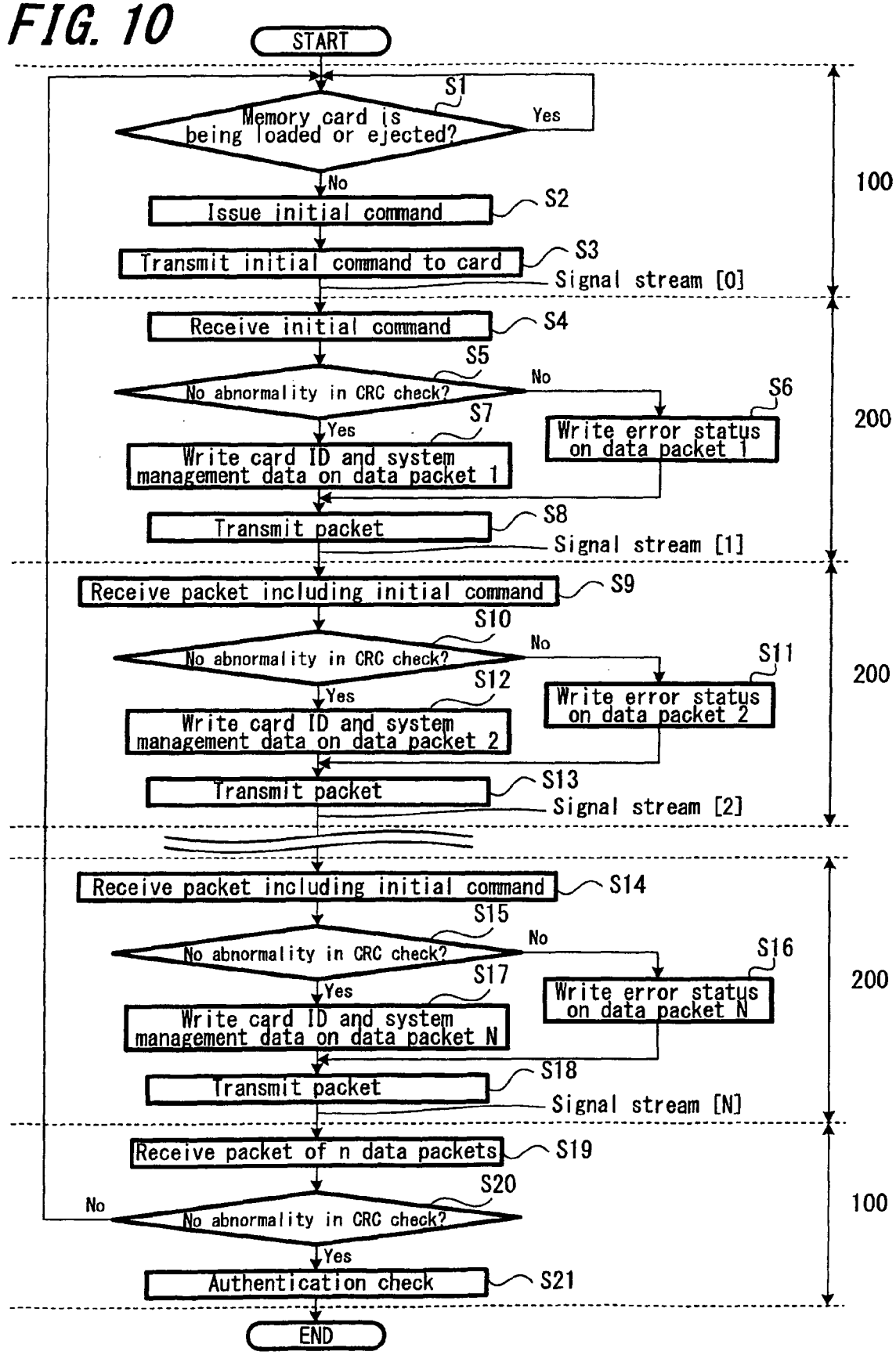
FIG. 10 is a flowchart for describing an example of the processing at the time of initial authentication in accordance with the embodiment of the present invention.
Figure 11:
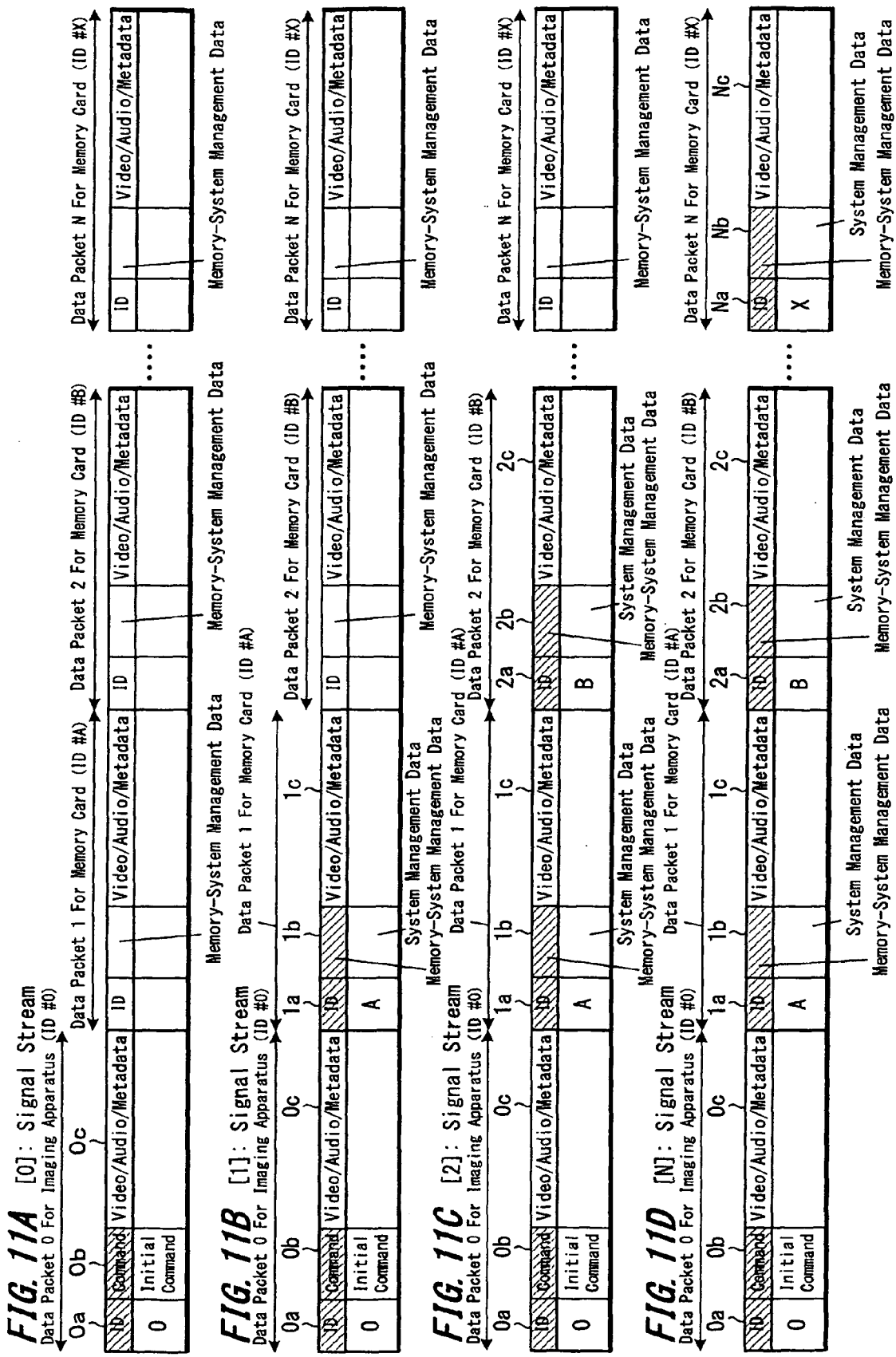
FIG. 11 is a diagram for illustrating an exemplified configuration of a signal packet in accordance with the embodiment of the present invention, where

Referring back to the flow chart in FIG. 10, the packet transmitted in Step S8 is received by the memory card 200 (ID #B) located above the memory card 200 of the ID #A (Step S9). A CRC check is also carried out in the memory card 200 of the ID #B, (Step S10). If any error has been detected, then an error status is written on the data packet 2, which is an area next to the data packet 1 (Step S11). If no error has been detected, then the own ID and system management data are written on the data packet 2 (Step S12). Subsequently, the packet thus generated is transmitted through the light-emitting unit 208 (Step S13). The packet to be transmitted in this step is referred to as a "signal stream [2]" and the exemplified configuration of the packet to be transmitted by the "signal stream [2] is illustrated in FIG. 11C.

In FIG. 11C, the data of the memory card 200 (ID #B) is written on the data packet 2 which is an area next to the data packet 1. The ID of the memory card 200, "B", is written in the area of "ID" (area 2a). System management data are written in the area for storing "memory-system management data" (area 2b).

In this way, the data packet on which the signal from the imaging apparatus 100 and the information of each memory card 200 are transmitted to the memory card 200 being inserted in the slot closest to the light-receiving unit 113 of the imaging apparatus 100. In this example, this memory card 200 is provided with the ID "X".

Referring back to the flowchart in FIG. 10, the signal transmitted between the respective memory cards 200 is received by the memory card 200 (ID #X) inserted in the slot closest to the light-receiving unit 113 of the imaging apparatus 100 (Step S14). Even the memory card 200 of the ID #X, a CRC check is carried out (Step S15). If any error has been detected, then an error status is written on the data packet N (Step S16). If no error has been detected, the own ID and system management data are written on the data packet N (Step S17). Subsequently, the generated packet is transmitted through the light-emitting unit 208 (Step S18). Here, the packet to be transmitted in this step is referred to as a "signal stream [N]" and the exemplified configuration of the packet to be transmitted by the "signal stream [N] is illustrated in FIG. 11D.

In FIG. 11D, the data of the memory card 200 (ID #X) is written on the data packet N. The ID of the memory card 200, "X", is written in the area of "ID" (area Na). System management data are written in the area for storing "memory-system management data" (area Nb).

Referring back to the flowchart in FIG. 10, the signal transmitted between the respective memory cards 200 is received by the light-receiving unit 113 of the imaging apparatus 100 (Step S19). The packet to be received here includes N data packets. Furthermore, a CRC check is also carried out in the imaging apparatus 100 (Step S20). If any error has been detected, then the processing returns to Step S1. If it is determined that no error has been detected, then an authenticating check of each memory card 200 is carried out on the basis of the information described in each received packet (Step S21).

In this way, the IDs and the system management data of the respective cards 200 are transmitted in order based on the initial command transmitted from the imaging apparatus 100 and finally received again by the light-receiving part 113 of the imaging apparatus 100. Thus, the imaging apparatus 100 is informed the number of the memory cards 200 inserted into the external recording-medium I/F unit 112 and is capable of assessing the capacity of each memory card 200.

Next, an example of the processing will be described with reference to FIG. 12 and FIG. 13. In this example, a recording command and content data are transmitted from the imaging apparatus 100 to the memory card 200. Then, the memory card 200, which has received the recording command and the content data, records the content data.

Figure 12:
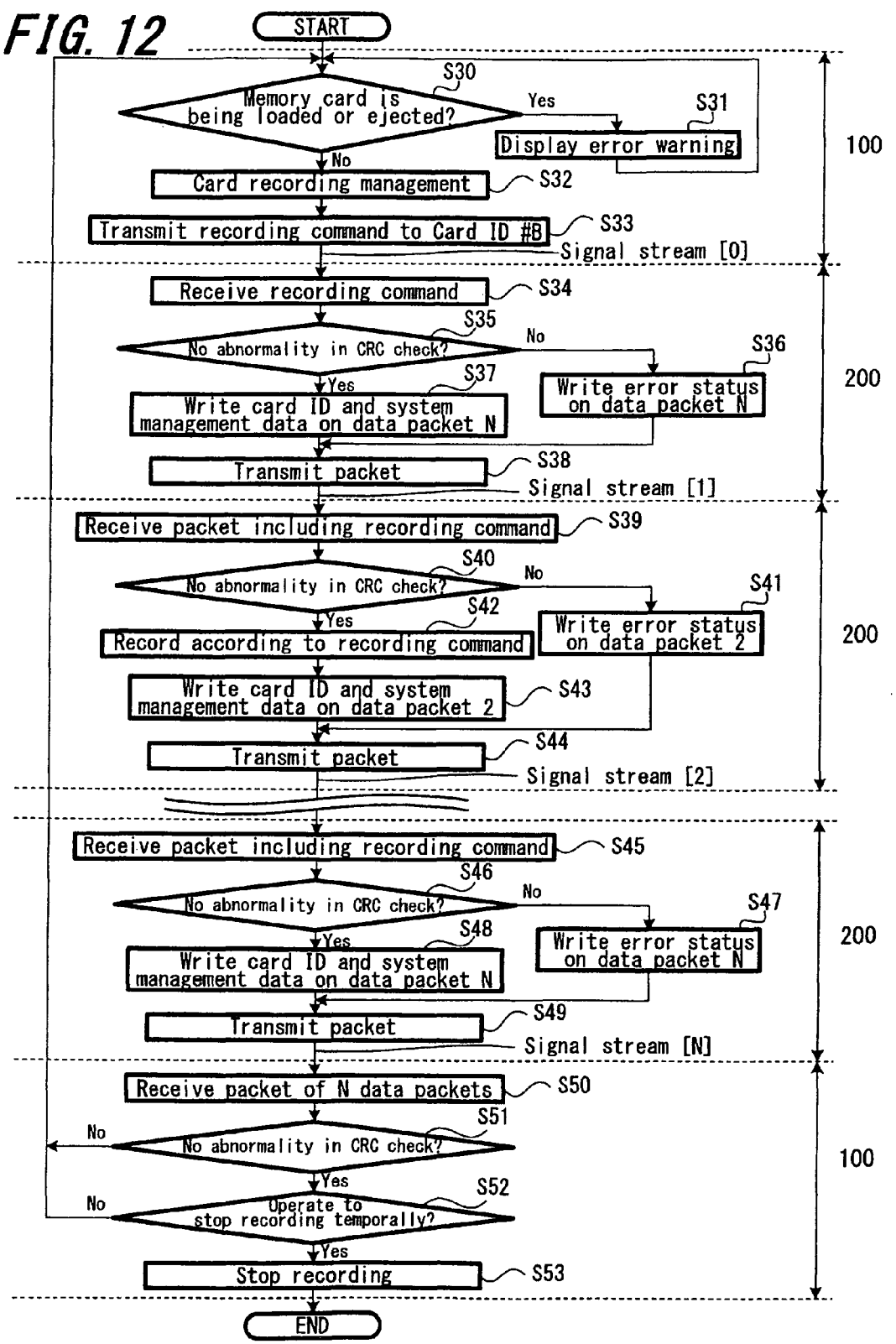
FIG. 12 is a flowchart for illustrating an example of processing at the time of recording in accordance with the embodiment of the present invention.

In the flowchart in FIG. 12, first, the loading/ejecting detector 118 of the imaging apparatus 100 determines whether the memory card 200 is being loaded or ejected in/from any slot of the external recording-medium I/F unit 112 (Step S30). If it is determined that any of the memory cards 200 inserted in the slot is being loaded or injected, then a warning of error is displayed on the display unit 123 (see FIG. 1) (Step S31). If it is determined that there is no memory card 200 being loaded or ejected, then a card recording management is carried out (Step S32).

The term "card recording management" is to determine what kind of content will be recorded on a specific area of a specific memory card 200 based on the ID and the system management data of each memory card 200, which are obtained by transmission of an initial command. Then, a command can be generated on the basis of the card recording management.

As a result of the card recording management carried out in Step S32, since the memory card 200 of the ID #B is selected as a destination on which data are to be recorded, a recording command which specifies the memory card 200 of the ID# B as a recording destination is transmitted from the light-emitting unit 111. Here, the packet to be transmitted is referred to as a "signal stream [0]" and the exemplified configuration of the packet to be transmitted over the signal stream [0] is illustrated in FIG. 13A. The ID of the imaging apparatus 100, "0", is written in the area of "ID" (area 0a) and a "recording command" is written in the area for storing a command (area 0b). In the recording command, the ID of the memory card is specified. Data desired to be recorded on the memory card 200 of the ID #B, such as video data, sound data, and metadata including a time code, are written in the area represented as a "Video/Audio/Metadata" (area 0c).

Referring back to the flowchart of FIG. 12, the packet transmitted from the imaging apparatus 100 in Step S33 is received by the memory card 200 (ID #A) located at the position closest to the light-emitting unit 111 of the imaging apparatus 100 (Step S34). When the memory card 200 receives a signal by its light-receiving unit 201 (see FIG. 2), the detection of an error in the received packet is carried out by the CRC arithmetic unit 260 (Step S35). If any error has been detected, then an error status is written on the data packet 1 (Step S36).

When no error has been detected in Step S35, it is determined whether the recording command is sent to the own destination or not. Subsequently, the processing is carried out on the basis of the determination result. In the example shown in FIG. 12, "B" is recorded in the recording command as a destination ID. Thus, the memory card 200 of the ID #A determines that the recording command is not addressed to the memory card 200 of the ID #A. If the memory card 200 receives a recording command having a destination different from the ID of the memory card 200, its own ID and system management data are written in the area of the "memory-system management data". Then, the memory card 200 of the ID #A directly transmits the recording command to the next memory card 200 or the imaging apparatus 100.

Accordingly, the memory card 200 of the ID #A writes its own ID and system management data on the data packet 1 (Step S37) and then transmits the data from the light-emitting unit 208 (Step S38). Here, the packet to be transmitted is referred to as a "signal stream [1 ]". The exemplified configuration of the packet to be transmitted over the signal stream [1] is illustrated in FIG. 13B.

The data packet 1, which is an area next to the data packet 0, is assigned to the memory card 200 (ID #A) in FIG. 13B. The ID of the memory card 200, "A", is written in the area of "ID" (area 1a). System management data are written in the area for storing "memory-system management data" (area 1b).

Referring back to the flowchart in FIG. 12, the packet (signal stream [1]) transmitted from Step S38 is received by the memory card 200 (ID #B) located above the memory card 200 of the ID #A (Step S39). A CRC check is also carried out in the memory card 200 of the ID #B (Step S40). If any error has been detected, then an error status is written on the data packet 2, which is an area next to the data packet 1 (Step S41). If no error has been detected, then it is determined whether the received recording command is sent to the own destination. The memory card 200 of the ID #B records content data and metadata included in the received packet on the basis of the recording command because the ID specified as a destination in the recording command is the own ID (Step S42). Subsequently, the own ID and system management data are written on the data packet 2 (Step S43). The packet thus generated is transmitted through the light-emitting unit 208 of the memory card 200 (ID #B) (Step S44). Here, the packet to be transmitted is referred to as a "signal stream [2]". The exemplified configuration of the packet to be transmitted over the signal stream [2] is illustrated in FIG. 13C.

In FIG. 13C, the data packet 2, which is an area next to the data packet 1, is assigned to the memory card 200 (ID #B). The ID of the memory card 200, "B", is written in the area of "ID" (area 2a) in FIG. 13C. System management data are written in the area for storing "memory-system management data" (area 2b). Content data and metadata being written in the area 0c of the data packet 0, which is an area for the imaging apparatus 100, are being recorded on the memory card 200 of the ID #B at Step S42. In FIG. 13C, therefore, the area 0c of the data packet 0 has no records.

Even after recording the data on the specified memory card 200, a data packet is transmitted between the memory cards 200 and finally transmitted to the memory card 200 (ID #X) inserted in the slot closest to the light-receiving unit 113 of the imaging apparatus 100 among the slots of the external recording-medium I/F unit 112 of the imaging apparatus 100.

Referring back to the flowchart in FIG. 12, the signal transmitted between the memory cards 200 is received by the memory card 200 (ID #X) inserted in the slot closest to the light-receiving unit 113 of the imaging apparatus 100 (Step S45). A CRC check is also carried out in the memory card 200 of the ID #X (Step S46). If any error has been detected, then an error status is written on the data packet N (Step S47). If no error has been detected, the own ID and system management data are written on the data packet N (Step S48). Subsequently, the generated packet is transmitted through the light-emitting unit 208 (Step S49). Here, the packet to be transmitted is referred to as a "signal stream [N]". The exemplified configuration of the packet to be transmitted over the signal stream [N] is illustrated in FIG. 13D.

In FIG. 13D, the data of the memory card 200 (ID #X) is written on the data packet N. The ID of the memory card 200, "X", is written in the area of "ID" (area Na). System management data are written in the area for storing "memory-system management data" (area Nb).

Referring back to the flowchart in FIG. 12, the signal transmitted between the memory cards 200 is received by the light-receiving unit 113 of the imaging apparatus 100 (Step S50). Here, the packet to be received here is one constructed of N data packets. Furthermore, a CRC check is also carried out in the imaging apparatus 100 (Step S51). If any error has been detected, then the processing returns to Step S30. If no error has been detected, it is determined whether the suspension of the recording is determined by an outcome of the operation input or the like to the operating unit 122 (see FIG. 1) (Step S52). If it is determined that the suspension of the recording is determined, then the recording is stopped (Step S53). If the suspension of the recording is not determined, then the processing returns to Step S30.

The same processing is also carried out when the user demands the reproduction of the content data recorded on the memory card 200. First, a data packet containing a reproduction command is transmitted from the imaging apparatus 100. When the memory card 200 with the ID specified in the reproduction command receives the packet, the content data and metadata recorded on the memory card 200 are read out thereof. The read-out content data and metadata are written on the data packet and then received again by the light-receiving unit 113 of the imaging apparatus 100 through the optical I/F. Furthermore, the content data recorded on the memory card 200 is reproduced through the display unit 123 of the imaging apparatus 100 or a speaker (not shown).

In this way, the signal transmitted from the imaging apparatus 100 is transmitted between or among plural memory cards 200 inserted in the respective slots of the external recording-medium I/F unit 112 of the imaging apparatus 100 through the optical I/F. Therefore, an increase in durability of the memory card 200 to the number of times of reading/writing signals from/to the memory card 200 can be attained.

Furthermore, in the above embodiment, the light-receiving unit 113 of the imaging apparatus 100 is fixed in place. However, the location of the light-receiving unit 113 of the imaging apparatus 100 arranged in the height direction thereof may be variable depending on the number or positions of the memory cards 200 inserted in the external recording-medium I/F unit 112. As constructed above, the distance between the light-receiving unit 113 of the imaging apparatus 100 and the light-emitting unit 208 of the memory card 200 can be reduced in size. Thus, it is possible to increase a signal to noise ratio (S/N ratio) with respect to the signal transmitted to the light-receiving unit 113 of the imaging apparatus 100.

Figure 14A:
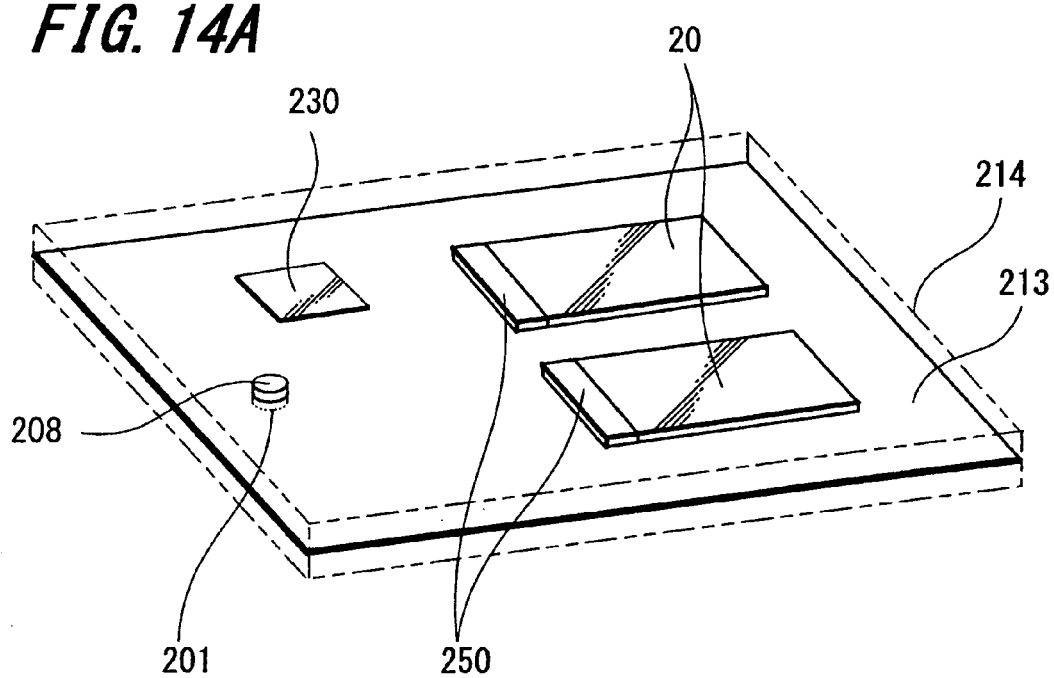
FIG. 14A is a perspective view of the memory card and FIG. 14B is a side view of the memory card.

Furthermore, in the above embodiment, the memory card on which the recording medium of the embodiment of the present invention is applied has been exemplified. Alternatively, the embodiment of the present invention may be applied to an adaptor connectable to any of general-purpose memory cards. The general-purpose memory cards include SD memory cards and high-flash memories compliant with MemoryStick™ interface specification. The exemplified configuration of an adaptor on which the embodiment of the present invention is applied is illustrated in FIG. 14. FIG. 14A illustrates an adaptor provided with two memory sockets 250. In this figure, the memory sockets 250 are connected with general-purposes memories 20, respectively. In FIG. 14A, the memory card enclosure 214 is represented by the dashed-two dotted line. The side face of the enclosure is provided with a power-supply potential unit 210 and a ground potential unit 220 but not shown in FIG. 14. The memory sockets 250 are mounted on a wiring substrate 213. In addition, a light-receiving unit 201, a light-emitting unit 208, and a transmission/reception control unit 230 for controlling the transmission/reception between the light-receiving unit 201 and the light-emitting unit 208 are also mounted on the same substrate.

In this case, not only is the transmission/reception control unit 230 mounted on the adaptor, but a control unit for controlling the respective units on the adaptor, a circuit for encoding/decoding of data, a memory for data saving at the time of encoding/decoding, or the like may also be mounted on the adaptor.

Figure 14B:
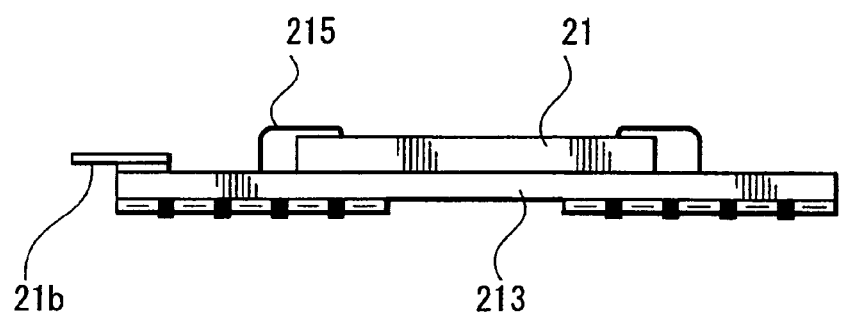

In this case, furthermore, a recording medium to be inserted into the memory socket 250 is not limited to a molded product, such as a general-purpose memory card 20, insofar as the recording medium is any of those having connectors connectable to the adaptor. For instance, as illustrated in FIG. 14(b), the recording medium may be configured to include a memory chip 21 fixed on a wiring substrate 213 with a wire 215 and can be connected through a connector 216.

Furthermore, in the above embodiment, clocks generated from the imaging apparatus 100 are overlaid with other signals, such as video signals and sound signals, and then supplied to the memory cards 200, respectively. For improving the accuracy of clock extraction in a PLL circuit (not shown) on the memory card 200, a scramble circuit may be mounted on the imaging apparatus 100 and also a descramble circuit may be mounted on the memory card 200. As constructed in this way, a direct current (DC) component is inhibited, so that clocks can be more accurately reproduced in the memory card 200.

Figure 15:
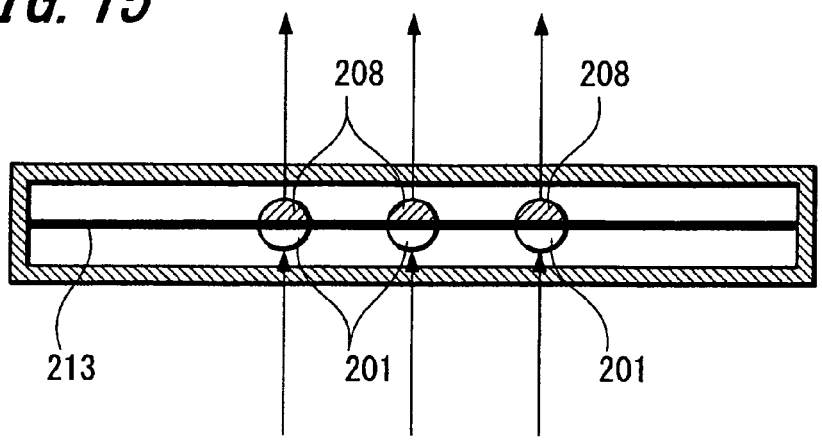
FIG. 15 is a cross-sectional view showing the arrangement of a light-receiving unit and a light-emitting unit in accordance with another embodiment of the present invention.
Figure 16:
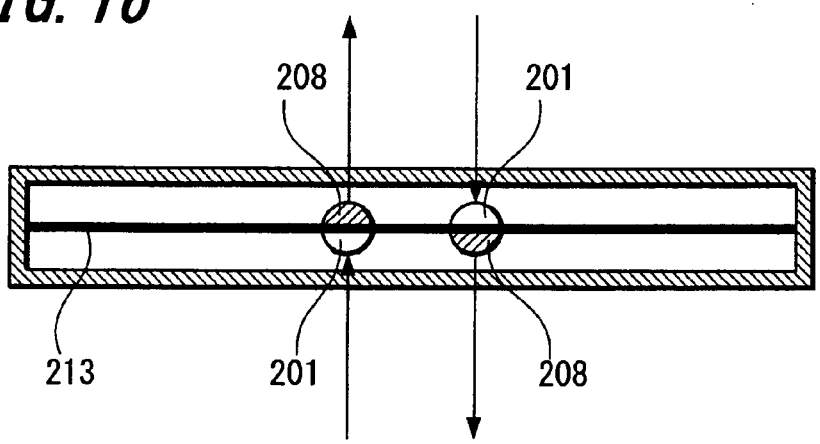
FIG. 16 is a cross-sectional view showing the arrangement of a light-receiving unit and a light-emitting unit in accordance with another embodiment of the present invention.

Furthermore, in the above embodiment, one of the imaging apparatus 100 and the respective memory cards 200 is provided with one light-receiving unit and one light-emitting unit. However, one of these may have two or more light-receiving units and two or more light-emitting units. For example, if one of the imaging apparatus 100 and the respective memory cards 200 has two light-receiving unit and two light-emitting units, two pass ways for signal transmission can be obtained. Thus, an improvement in transmission rate can be attained. Furthermore, as shown in FIG. 15, a plurality of the light-receiving unit 201 and the light-emitting unit 208 in combination may be mounted on the memory card 200 (three combinations in FIG. 15) and one of the combination may be used for the transmission of clocks. In this case, any PLL circuit may not be required to be mounted on the memory card 200, so that a simplified circuit and cost-saving may be attained. Furthermore, if two or more combinations of the light-receiving unit 201 and the light-emitting unit 208 are provided, as shown in FIG. 16, the locations of the light-receiving units 201 and the light-emitting units 208 may be differently arranged to change the directions of signal flows.

Figure 17:
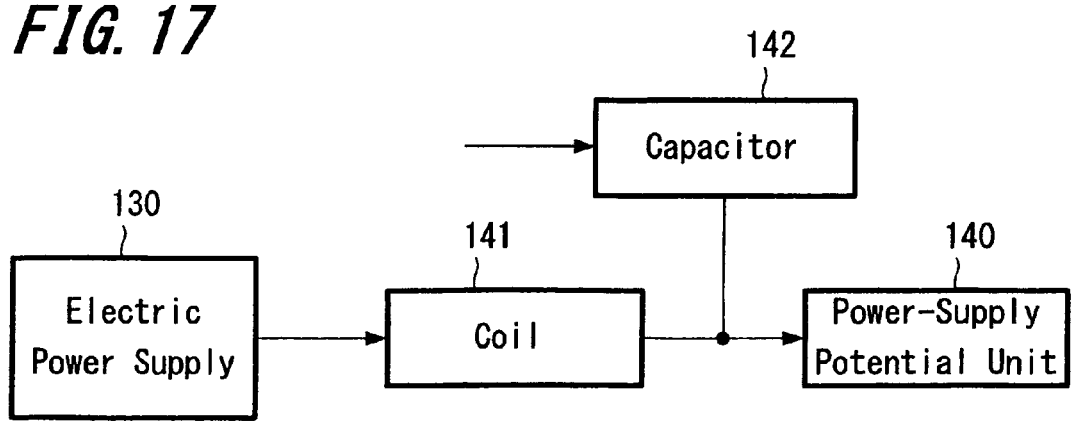
FIG. 17 is a block diagram for illustrating an exemplified configuration of a overlaid circuit in accordance with another embodiment of the present invention.

Furthermore, in the above embodiment, clocks generated from the imaging apparatus 100 are overlaid with other signals, such as video signals and sound signals, and then supplied to the memory cards 200 through the optical I/F, respectively. Alternatively, the clocks generated from the imaging apparatus 100 may be overlaid with the supply of electric power and then supplied to the memory card 200. The exemplified configuration of the overlaid circuit of this case is illustrated in FIG. 17. Clocks supplied via the capacitor 142 at a overlaid circuit including the coil 141 and the capacitor 142 are overlaid with the supply of electric power from the electric power supply 130 of the imaging apparatus 100, and the obtained clocks are then supplied to the power-supply potential unit.

Figure 18:
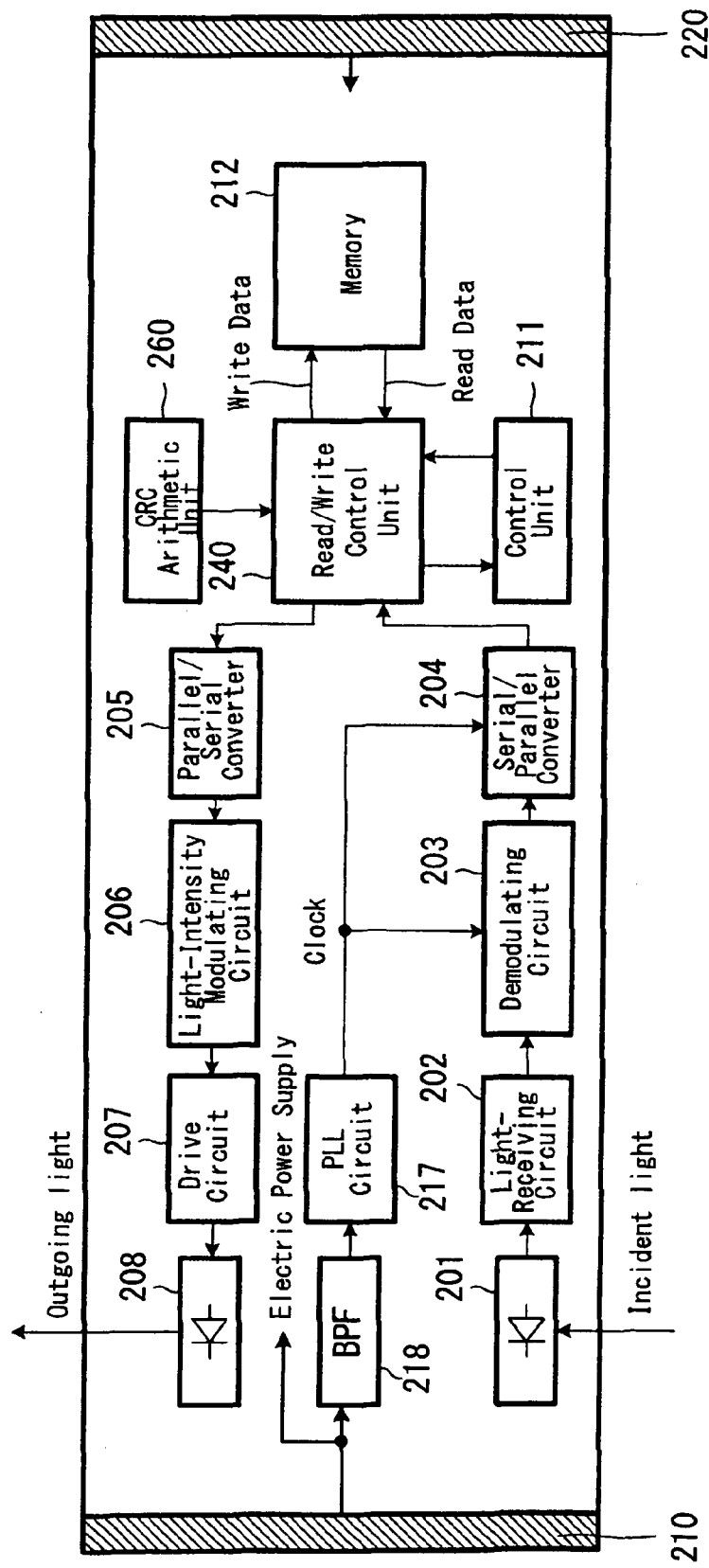
FIG. 18 is a block diagram for illustrating an exemplified configuration of the memory card in accordance with another embodiment of the present invention.

When the clocks are overlaid with the supply of electric power from the memory card 200, it is preferable that the memory card 200 be provided with a circuit for clock extraction. In the case of a memory card 200' illustrated in FIG. 18, a band pass filter (BPF) 218 is mounted on the memory card 200' to extract the frequency component of the clock from the clock-overlaid electric power supply from the power-supply potential unit 210. Thus, the PLL circuit 217 is designed to reproduce clocks from signals filtered by the BPF 218.

Furthermore, in the above embodiment, the memory card to be attached on an external apparatus, such as an imaging apparatus, has been described as an exemplified application of the present invention. However, the present invention may also be applied to a memory chip with a reader/writer incorporated in a cellular phone unit or the like.

In the above embodiment, the imaging apparatus capable of imaging, recording, and reproducing an image of a photographic subject has been described as an exemplified application of the present invention. However, the present invention may also be applied to a recording/reproducing apparatus without an imaging unit, which is only capable of recording and reproduction.

It should be understood by those skilled in the art that various modifications, combinations, sub-combinations and alterations may occur depending on design requirements and other factors insofar as they are within the scope of the appended claims or the equivalents thereof.

What is claimed is:

1. A memory card attached to an external apparatus for transmitting and receiving data via the external apparatus and an optical communication, the memory card comprising:
   a power-supply potential unit receiving electric power supply at a predetermined voltage from the external apparatus;
   a ground potential unit connected to a ground potential unit of the external apparatus;
   a light-receiving unit receiving an optical signal transmitted from the external apparatus or another memory card; and
   a light-emitting unit transmitting the optical signal to the external apparatus or another memory card,
   wherein the light-receiving unit and the light-emitting unit are arranged such that the optical signal received by the light-receiving unit and the optical signal transmitted from the light-emitting unit are transmitted in a straight line,
   the power-supply potential unit is provided on any one of a plurality of side surfaces of the memory card that is disposed between a top surface and a bottom surface of the memory card and is arranged to face a power-supply potential side surface of the external apparatus into which the memory card is inserted, and
   the area of the power-supply potential unit is one half or less of the side surface on which the power-supply potential unit is formed such that the power-supply potential unit is completely enclosed by the external apparatus upon the memory card being sufficiently inserted into the external apparatus that electrical contact between the power-supply potential unit and the power-supply potential side surface of the external apparatus is initiated, thereby protecting a user inserting the memory card into the external apparatus from contact with the power-supply potential unit while the power-supply potential unit is at the power-supply potential.

2. A memory card according to claim 1, wherein the light-receiving unit and the light-emitting unit are linearly arranged on upper and lower positions along a thickness direction of the memory card, and the light-receiving surface of the light-receiving unit and the light-emitting surface of the light-emitting unit are arranged in opposite directions.

3. A memory card according to claim 1, wherein the light-receiving unit and the light-emitting unit are linearly arranged such that the light-receiving surface of the light-receiving unit and the light-emitting surface of the light-emitting unit face each other; and an optical signal entered into the light-receiving unit and an optical signal output from the light-emitting unit are transmitted via a mirror placed between the light-receiving unit and the light-emitting unit.

4. A memory card according to claim 1, wherein the ground potential unit is provided on any one of a plurality of side surfaces disposed between the top surface and the bottom surface of the memory card.

5. A memory card according to claim 1, further comprising an adaptor formed on one of the top surface or the bottom surface of the memory card for connecting to a wiring substrate incorporating a general-purpose memory card or memory chip, wherein the general-purpose memory card or memory chip connected to the adaptor is provided as a recording unit for recording data.

6. An imaging apparatus transmitting and receiving data via a memory card using an optical signal, the imaging apparatus comprising:
    an imaging unit capturing an image of a photographic subject to generate a video signal;
    an external recording medium interface capable of enclosing a plurality of memory cards in vertical direction for recording the video signal obtained by the imaging unit;
    a power-supply potential unit supplying electric power to the memory card;
    a ground potential unit connected with the memory card;
    a light-emitting unit transmitting an optical signal to the memory card; and
    a light-receiving unit receiving the optical signal transmitted from the memory card,
    wherein the power-supply potential unit and the ground potential unit are mounted on a contact surface with memory card located at the external recording medium interface,
    the light-receiving unit and the light-emitting unit are arranged such that a signal transmitted from the light-emitting unit and received by the memory card and a signal transmitted from the memory card and received by the light-receiving unit are transmitted in a straight line in the vertical direction,
    the power-supply potential unit is disposed on an inner side surface of the external recording medium interface and configured to contact only part of a side surface of the memory card that is disposed between a top surface and a bottom surface of the memory card, and
    the area of the power-supply potential unit is one half or less of the inner side surface of the external recording medium interface such that the external recording medium interface completely encloses the part of the side surface of the memory card upon the memory card being sufficiently inserted into the external recording medium interface that electrical contact between the power-supply potential unit and the part of side surface of the memory card is initiated, thereby protecting a user inserting the memory card into the external apparatus from contact with the part of the side surface of the memory card while the part of the side surface of the memory card is at the power-supply potential.

7. An imaging apparatus according to claim 6, wherein the position of the light-receiving unit can be changed with the position of the memory card aligned in the vertical direction that is attached to the external recording medium interface.

8. An imaging apparatus transmitting and receiving data via a memory card using an optical signal, the imaging apparatus comprising:
    an imaging unit capturing an image of a photographic subject to generate a video signal;
    an external recording medium interface capable of enclosing a plurality of memory cards in vertical direction for recording the video signal obtained by the imaging unit;
    a power-supply potential unit supplying electric power to the memory card;
    a ground potential unit connected with the memory card;
    a light-emitting unit transmitting an optical signal to the memory card; and
    a light-receiving unit receiving the optical signal transmitted from the memory card,
    wherein the power-supply potential unit and the ground potential unit are mounted on a contact surface with memory card located at the external recording medium interface,
    the light-receiving unit and the light-emitting unit are arranged such that a signal transmitted from the light-emitting unit and received by the memory card and a signal transmitted from the memory card and received by the light-receiving unit are transmitted in a straight line in the vertical direction, and
    when the imaging apparatus receives electric power supply or the memory card is inserted into or ejected from the external recording medium interface, identification information and administration information of the memory cards are transmitted in the order from a memory card inserted at a position closest to the light-emitting unit to an adjacent memory card in the direction in which the light-receiving unit is mounted, and the light-receiving unit receives a signal including the identification information and the administration information of all the memory cards inserted in the external recording medium interface.

9. An imaging apparatus according to claim 6, wherein the light-receiving unit and the light-emitting unit are both utilized for signal transmission and clock transmission.

10. An imaging apparatus according to claim 6, wherein the electric power supply to the memory card via the power-supply potential unit is overlaid with a clock.

11. A recording-reproducing apparatus transmitting and receiving data via a plurality of memory cards using an optical signal, the recording-reproducing apparatus comprising:
    an external recording medium interface enclosing a plurality of memory cards in vertical direction;
    a power-supply potential unit supplying electric power to the memory card;
    a ground potential unit connected with the memory card;
    a light-emitting unit transmitting an optical signal to the memory card; and
    a light-receiving unit receiving the optical signal transmitted from the memory card,
    wherein the power-supply potential unit and the ground potential unit are mounted on a contact surface with memory card located at the external recording medium interface,
    the light-receiving unit and the light-emitting unit are arranged such that a signal transmitted from the light-emitting unit and received by the memory card and a signal transmitted from the memory card and received by the light-receiving unit are transmitted in a straight line in the vertical direction,
    the power-supply potential unit is disposed on an inner side surface of the external recording medium interface and configured to contact only part of a side surface of the memory card that is disposed between a top surface and a bottom surface of the memory card, and
    the area of the power-supply potential unit is one half or less of the inner side surface of the external recording medium interface such that the external recording medium interface completely encloses the part of the side surface of the memory card upon the memory card being sufficiently inserted into the external recording medium interface that electrical contact between the power-supply potential unit and the part of side surface of the memory card is initiated, thereby protecting a user inserting the memory card into the external apparatus from contact with the part of the side surface of the memory card while the part of the side surface of the memory card is at the power-supply potential.

12. A recording-reproducing apparatus according to claim 11, wherein the position of the light-receiving unit can be changed with the position of the memory card aligned in the vertical direction that is attached to the external recording medium interface.

13. A recording-reproducing apparatus transmitting and receiving data via a plurality of memory cards using an optical signal, the recording-reproducing apparatus comprising:
   an external recording medium interface enclosing a plurality of memory cards in vertical direction;
   a power-supply potential unit supplying electric power to the memory card;
   a ground potential unit connected with the memory card;
   a light-emitting unit transmitting an optical signal to the memory card; and
   a light-receiving unit receiving the optical signal transmitted from the memory card,
   wherein the power-supply potential unit and the ground potential unit are mounted on a contact surface with memory card located at the external recording medium interface,
   the light-receiving unit and the light-emitting unit are arranged such that a signal transmitted from the light-emitting unit and received by the memory card and a signal transmitted from the memory card and received by the light-receiving unit are transmitted in a straight line in the vertical direction, and
   when the recording-reproducing apparatus receives electric power supply or the memory card is inserted into or ejected from the external recording medium interface, identification information and administration information of the memory cards are transmitted in the order from a memory card inserted at a position closest to the light-emitting unit to an adjacent memory card in the direction in which the light-receiving unit is mounted, and the light-receiving unit receives a signal including the identification information and the administration information of all the memory cards inserted in the external recording medium interface.

14. A recording-reproducing apparatus according to claim 11, wherein the light-receiving unit and the light-emitting unit are both utilized for signal transmission and clock transmission.

15. A recording-reproducing apparatus according to claim 11, wherein the electric power supply to the memory card via the power-supply potential unit is overlaid with a clock.

16. An imaging apparatus according to claim 8, wherein the position of the light-receiving unit can be changed with the position of the memory card aligned in the vertical direction that is attached to the external recording medium interface.

17. An imaging apparatus according to claim 8, wherein the light-receiving unit and the light-emitting unit are both utilized for signal transmission and clock transmission.

18. An imaging apparatus according to claim 8, wherein the electric power supply to the memory card via the power-supply potential unit is overlaid with a clock.

19. A recording-reproducing apparatus according to claim 13, wherein the position of the light-receiving unit can be changed with the position of the memory card aligned in the vertical direction that is attached to the external recording medium interface.

20. A recording-reproducing apparatus according to claim 13, wherein the light-receiving unit and the light-emitting unit are both utilized for signal transmission and clock transmission.

21. A recording-reproducing apparatus according to claim 13, wherein the electric power supply to the memory card via the power-supply potential unit is overlaid with a clock.

* * * * *